United States Patent
Matsuoka

(10) Patent No.: US 9,966,123 B2
(45) Date of Patent: May 8, 2018

(54) SEMICONDUCTOR MEMORY DEVICE WITH WRITE DRIVER

(71) Applicant: TOSHIBA MEMORY CORPORATION, Minato-ku, Tokyo (JP)

(72) Inventor: Fumiyoshi Matsuoka, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days. days.

(21) Appl. No.: 15/449,198

(22) Filed: Mar. 3, 2017

(65) Prior Publication Data

US 2018/0075893 A1 Mar. 15, 2018

Related U.S. Application Data

(60) Provisional application No. 62/394,169, filed on Sep. 13, 2016.

(51) Int. Cl.
*G11C 11/16* (2006.01)

(52) U.S. Cl.
CPC ...... *G11C 11/1675* (2013.01); *G11C 11/1655* (2013.01); *G11C 11/1657* (2013.01); *G11C 11/1673* (2013.01)

(58) Field of Classification Search
CPC .................................................. G11C 11/1675
USPC ...................................................... 365/158
See application file for complete search history.

(56) References Cited

U.S. PATENT DOCUMENTS

| | | | | | |
|---|---|---|---|---|---|
| 5,598,376 | A | * | 1/1997 | Merritt | G06F 12/0638 365/189.05 |
| 7,764,536 | B2 | * | 7/2010 | Luo | G11C 11/16 365/148 |
| 8,315,090 | B2 | * | 11/2012 | Ong | G11C 11/1655 365/158 |
| 8,634,232 | B2 | * | 1/2014 | Oh | G11C 8/08 365/158 |
| 9,064,590 | B2 | * | 6/2015 | Ueda | G11C 11/1673 |
| 2002/0001234 | A1 | * | 1/2002 | Merritt | G06F 12/0638 365/189.05 |
| 2011/0151966 | A1 | | 6/2011 | Lee | |
| 2012/0257444 | A1 | | 10/2012 | Oh | |
| 2014/0160831 | A1 | | 6/2014 | Lee et al. | |
| 2014/0211537 | A1 | | 7/2014 | Yu et al. | |

FOREIGN PATENT DOCUMENTS

JP 5657821 B2 1/2015

* cited by examiner

*Primary Examiner* — Son Mai
(74) *Attorney, Agent, or Firm* — Holtz, Holtz & Volek PC

(57) ABSTRACT

According to one embodiment, a semiconductor memory device includes a first memory cell capable of storing one of first and second data, first and second lines coupled to the first memory cell, a first controller capable of simultaneously outputting first and second signals, and a first driver configured to apply a first voltage to the first line and apply a second voltage to the second line according to the first data and an asserted first signal in the first data writing, and apply a third voltage to the first line and apply a fourth voltage to the second line according to the second data and an asserted second signal in the second data writing.

20 Claims, 21 Drawing Sheets

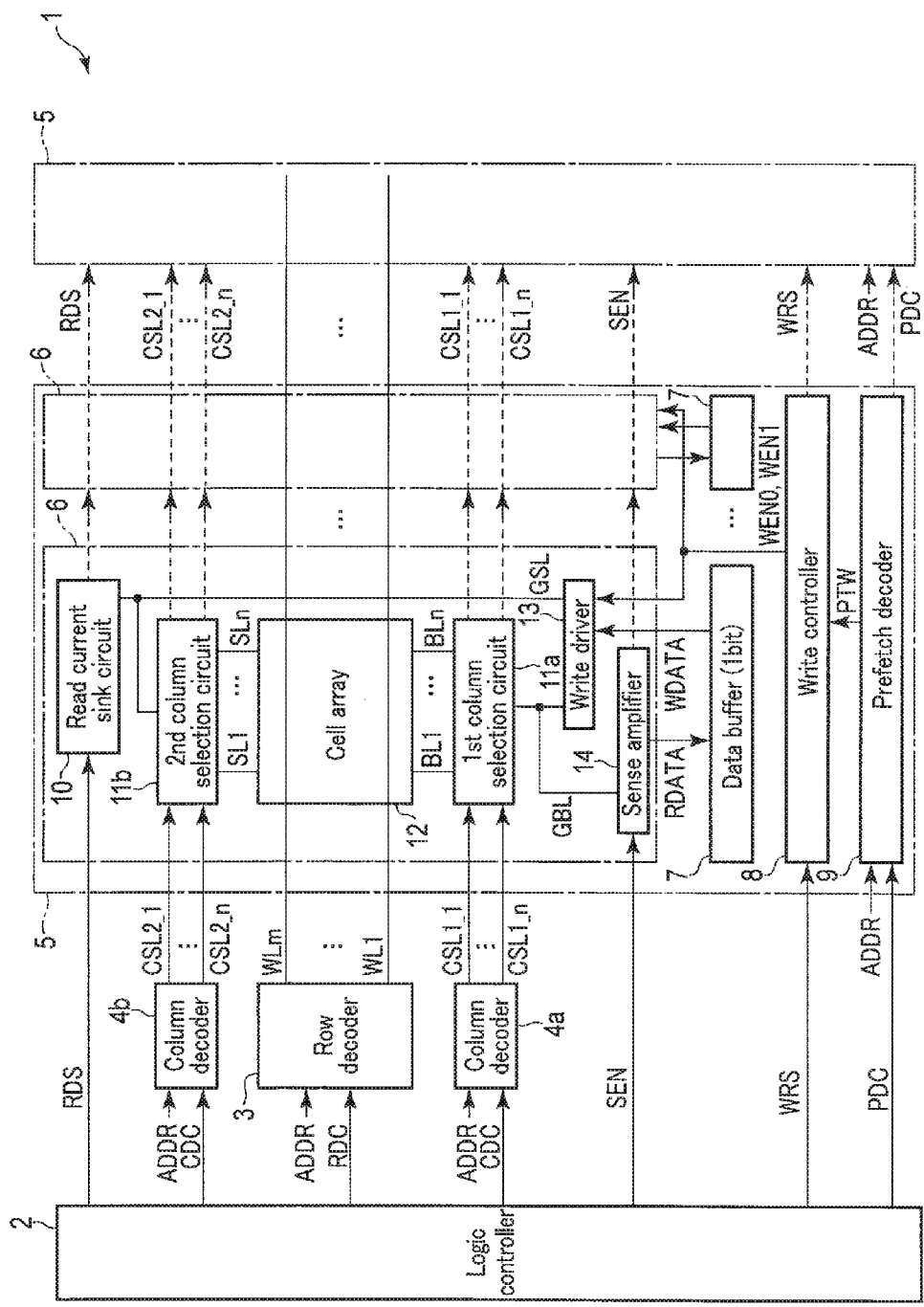
F I G. 1

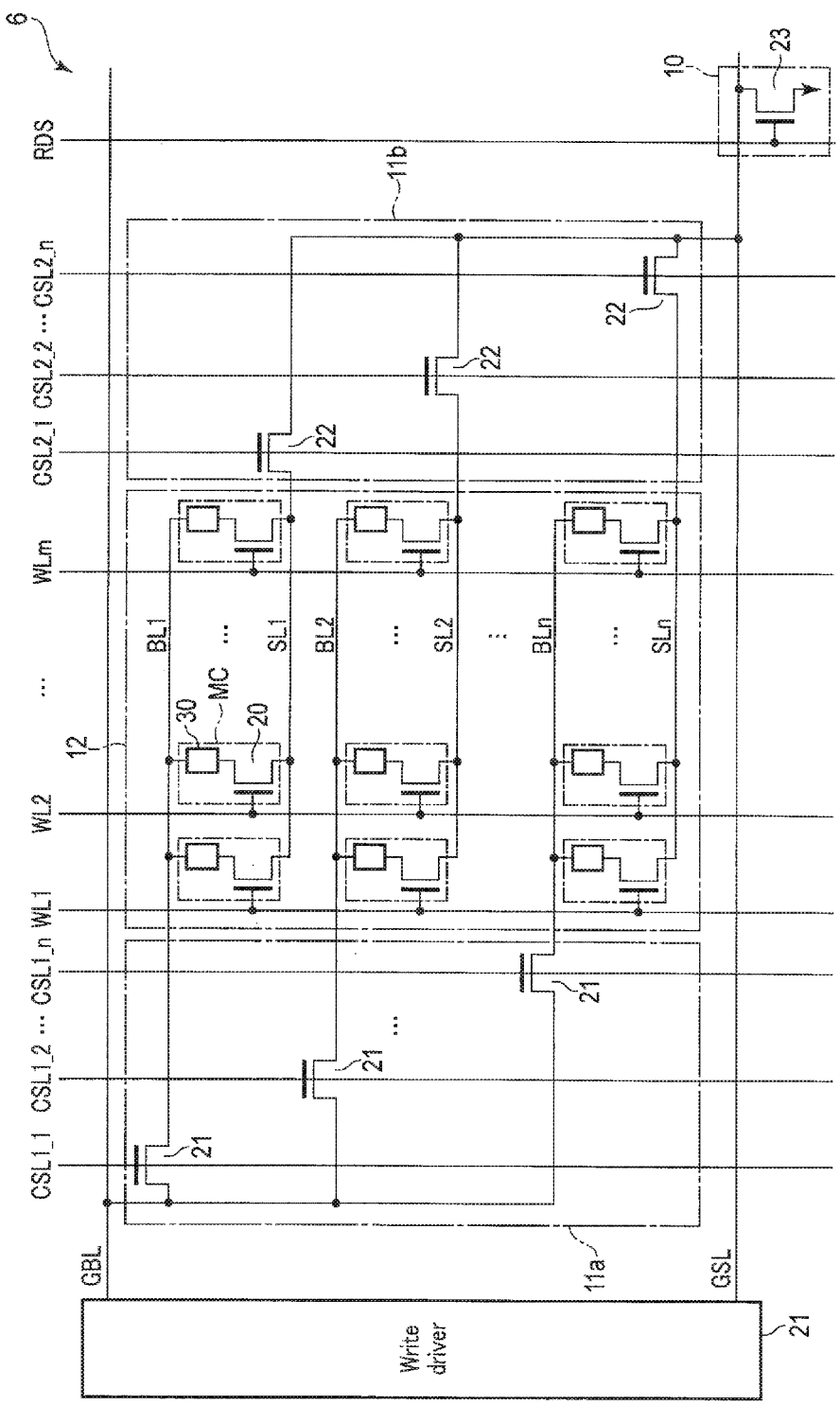
F I G. 2

Parallel state (low resistance)

Antiparallel state (high resistance)

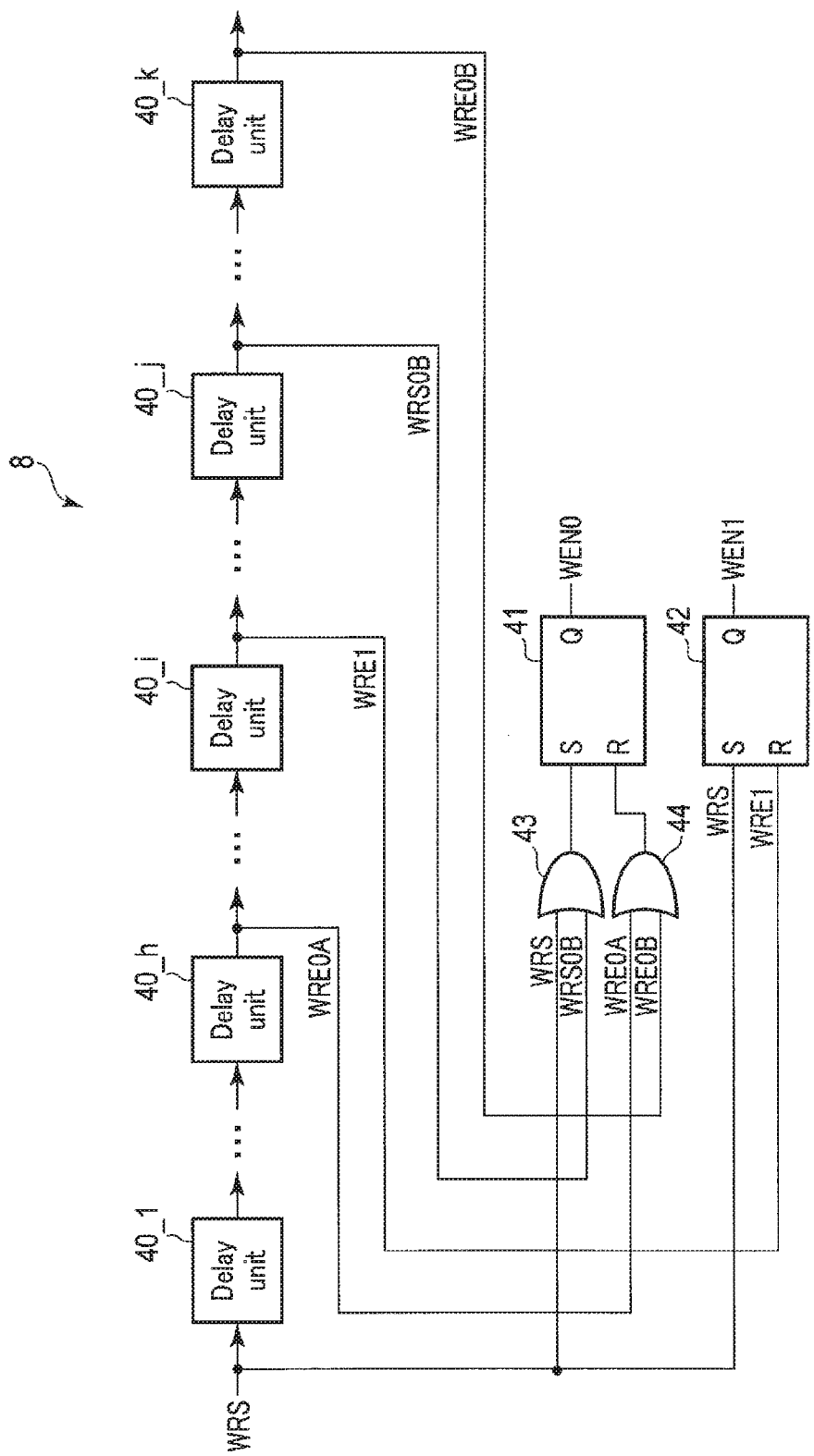
F I G. 9

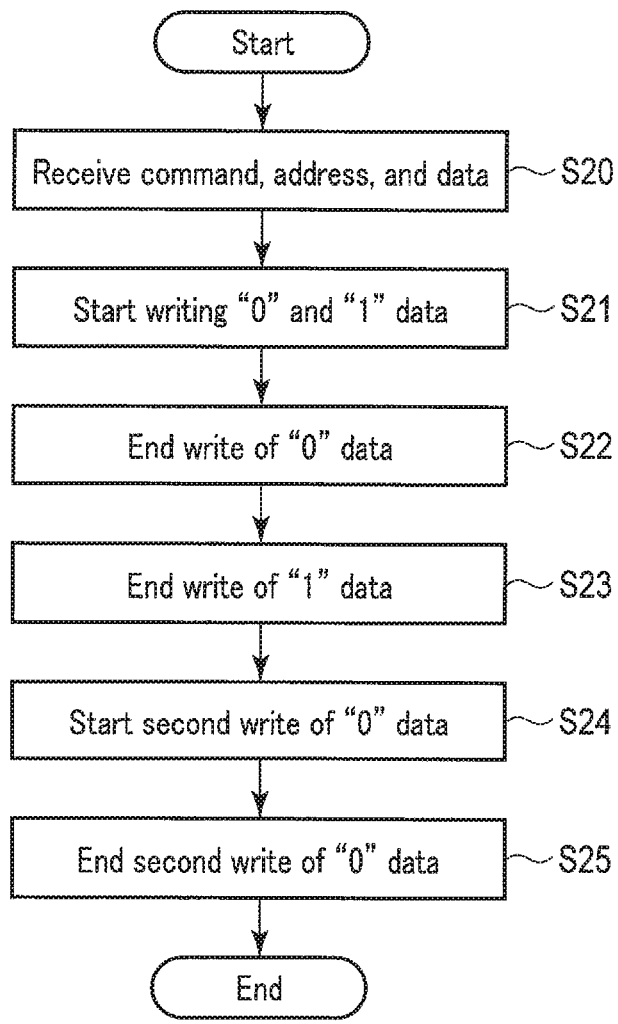
F I G. 10

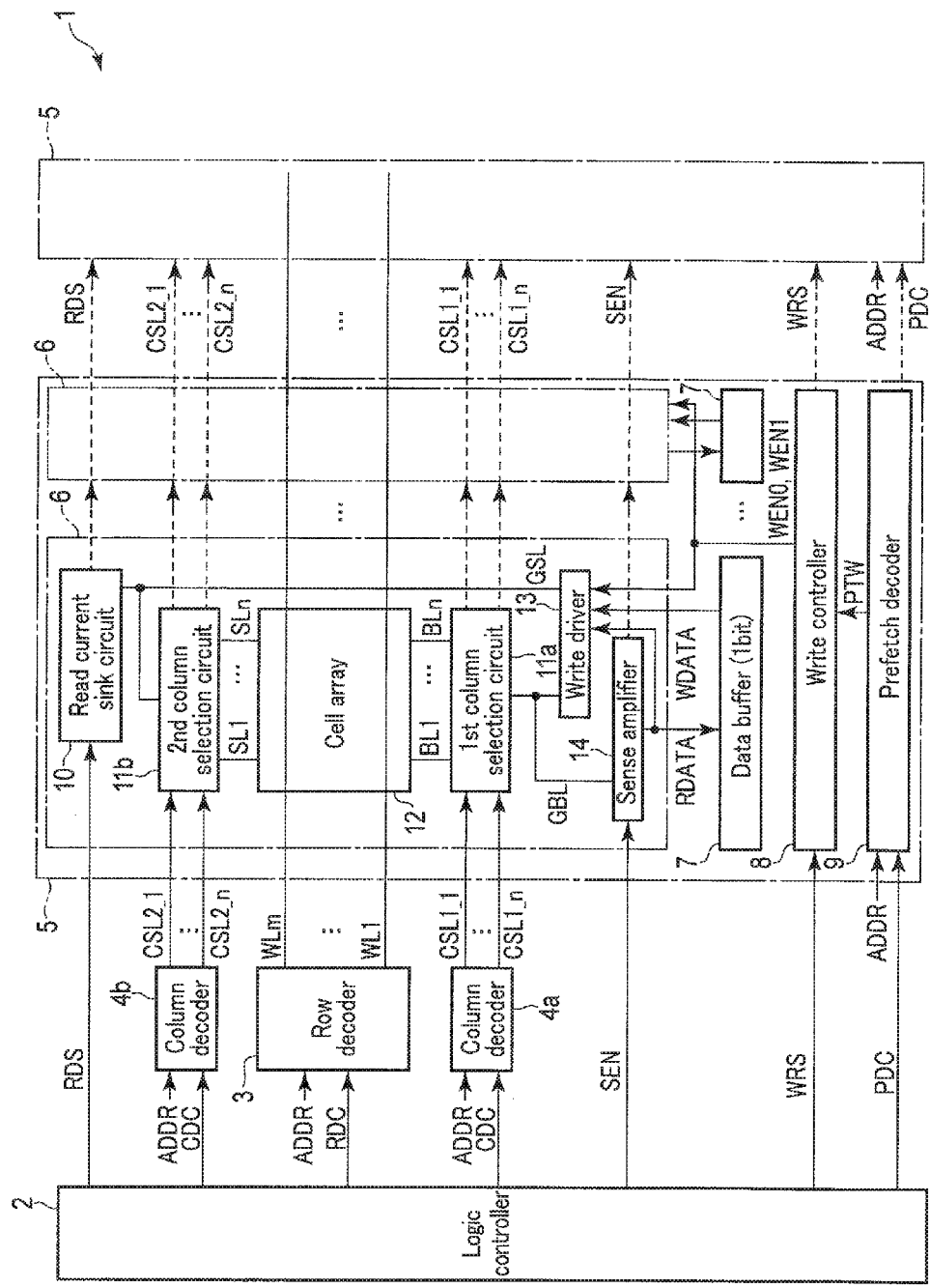
F I G. 12

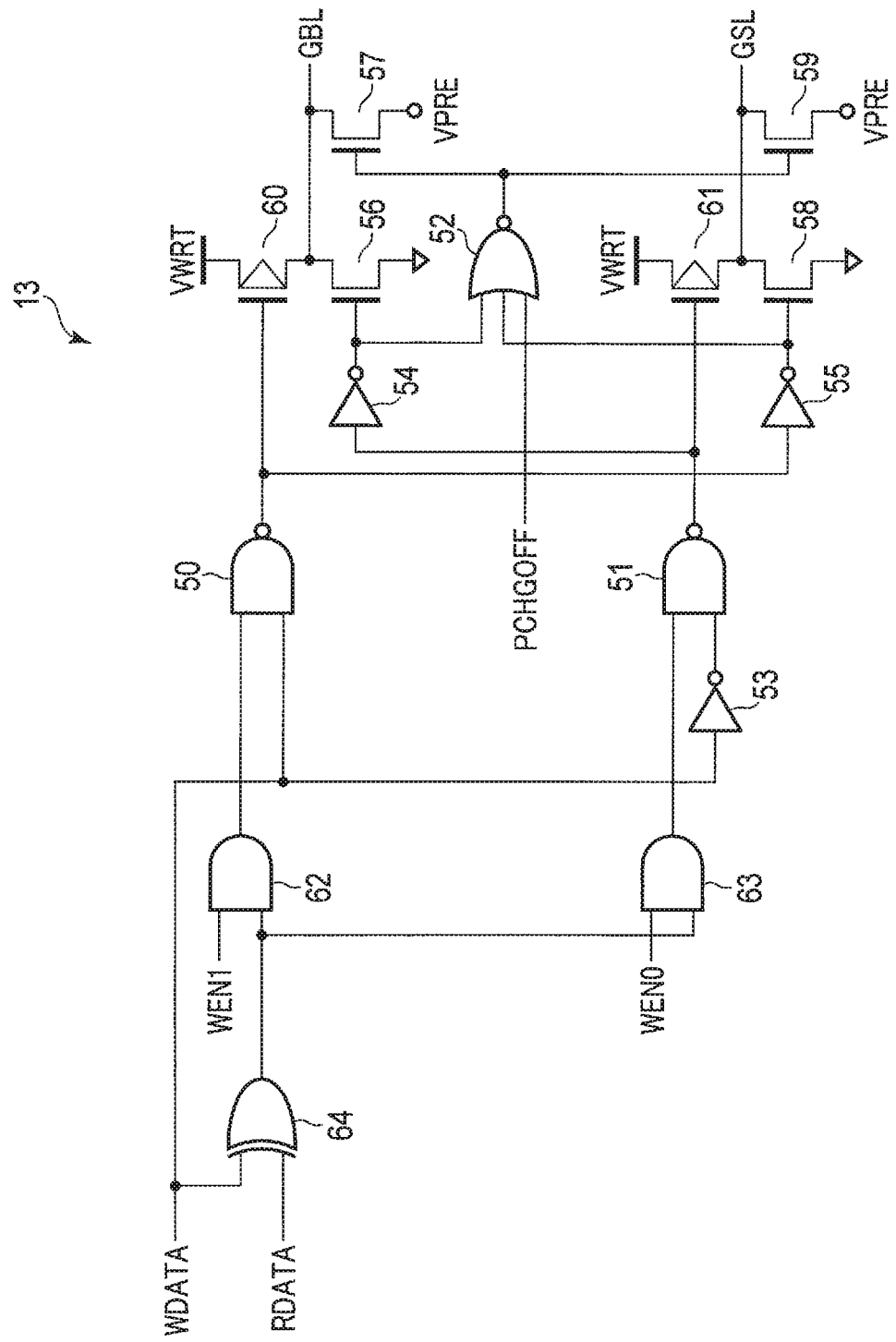
F I G. 13

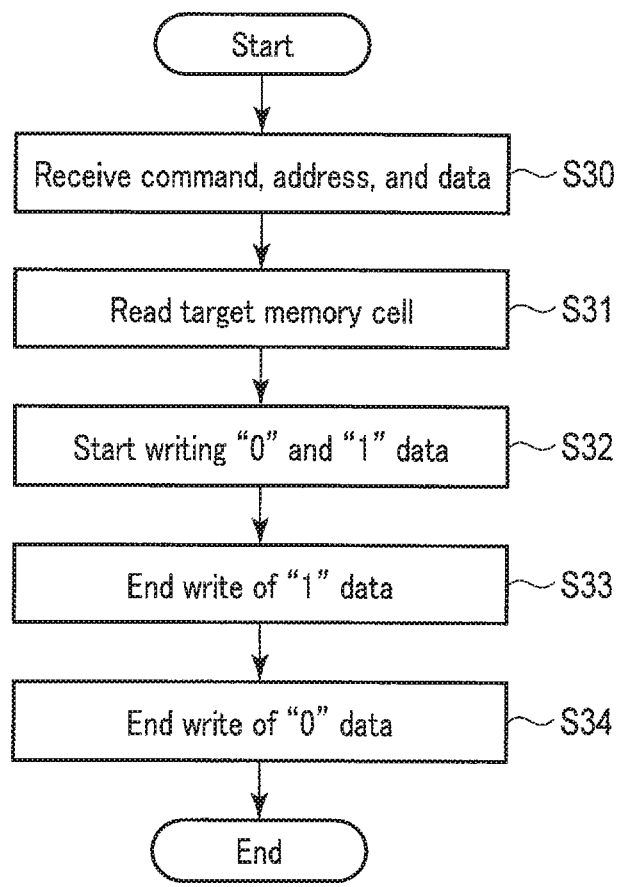
F I G. 14

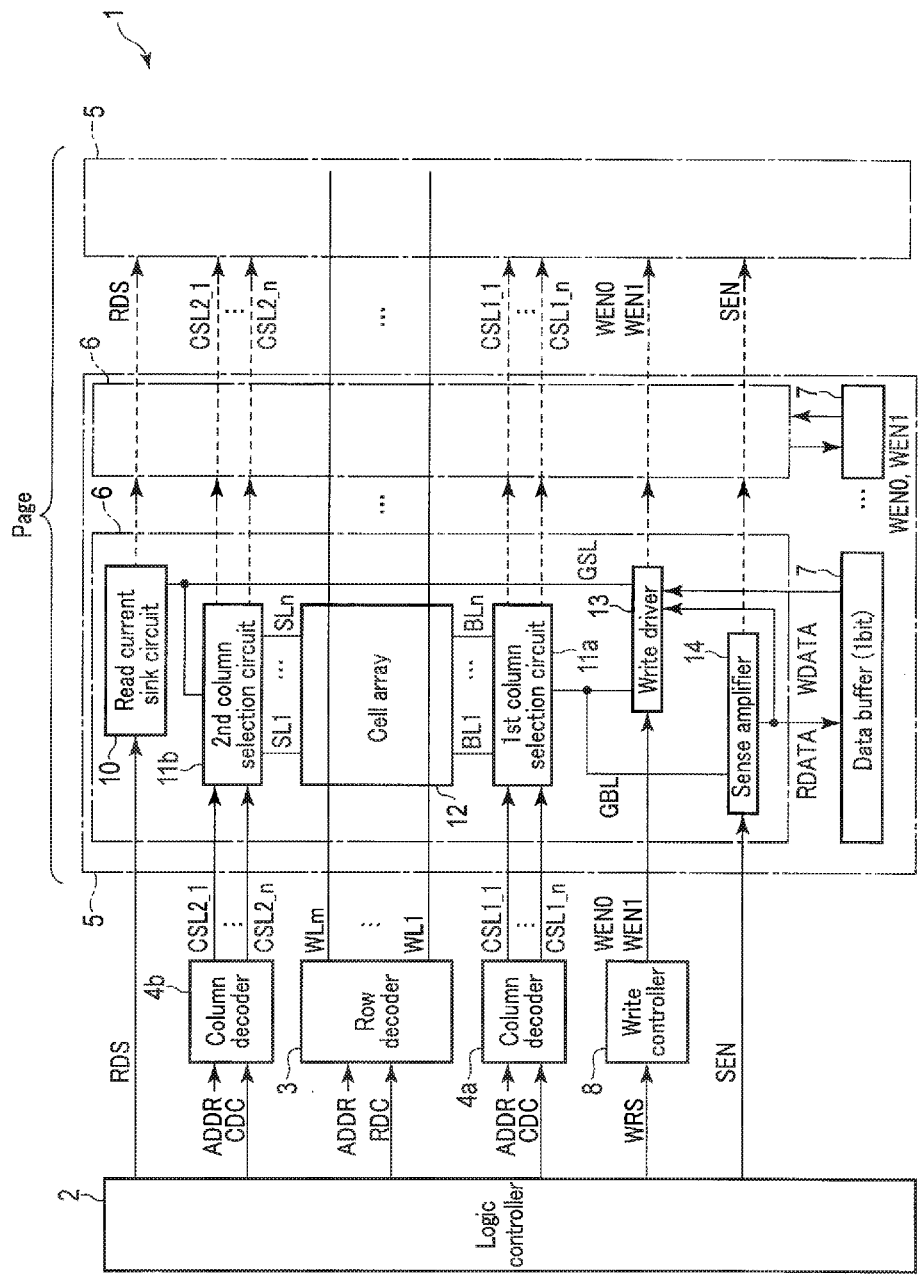
F I G. 15

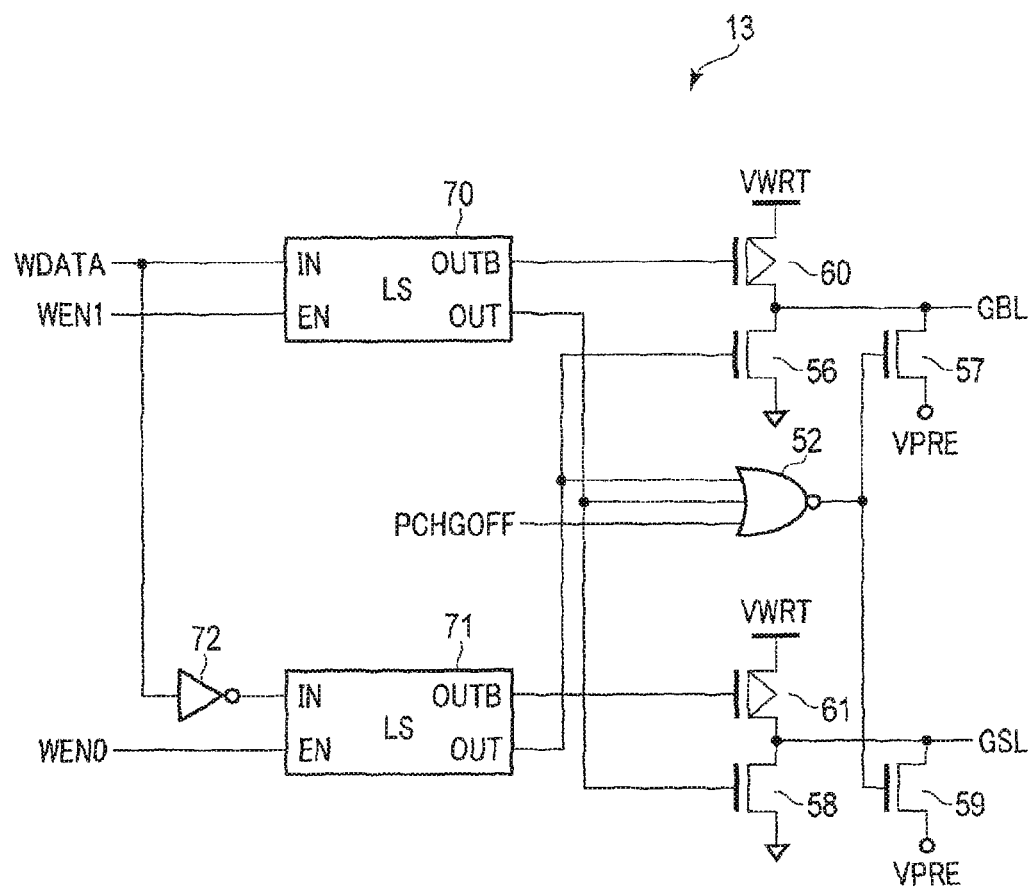
F I G. 16

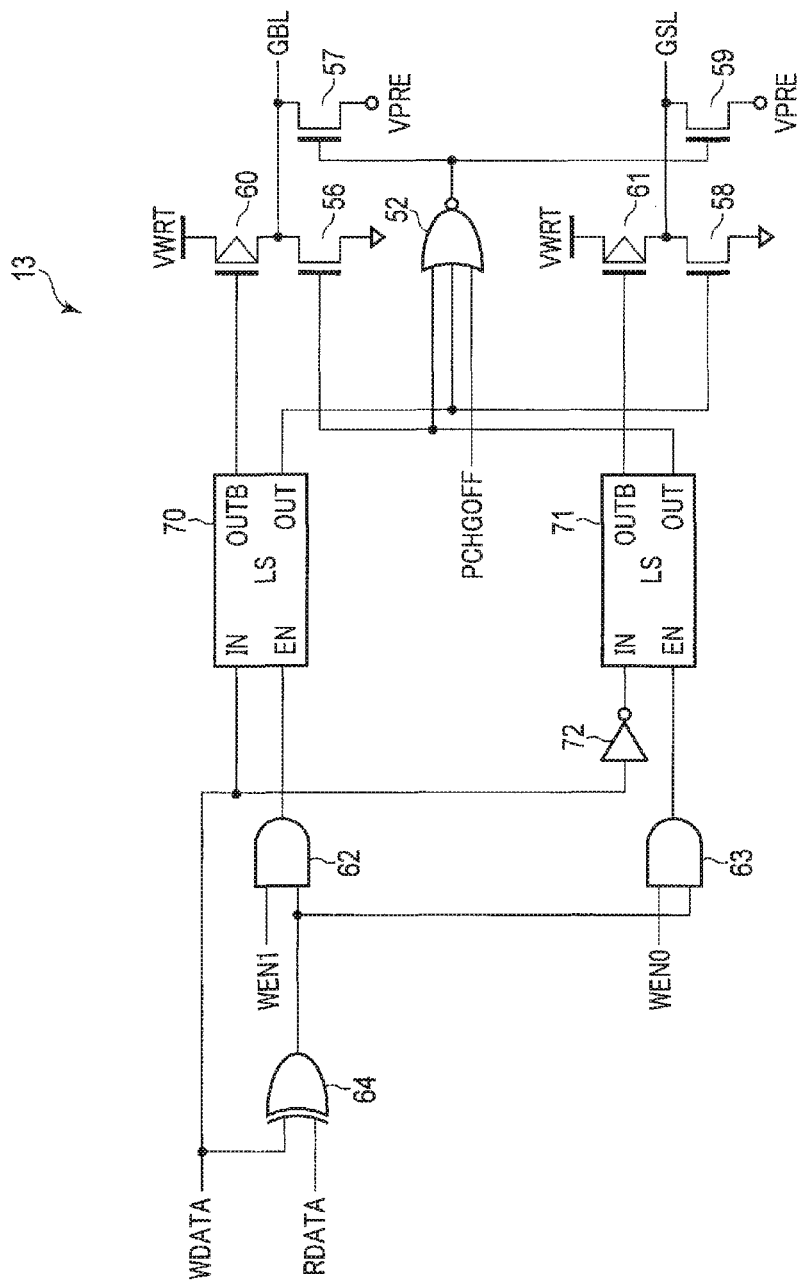
F I G. 18

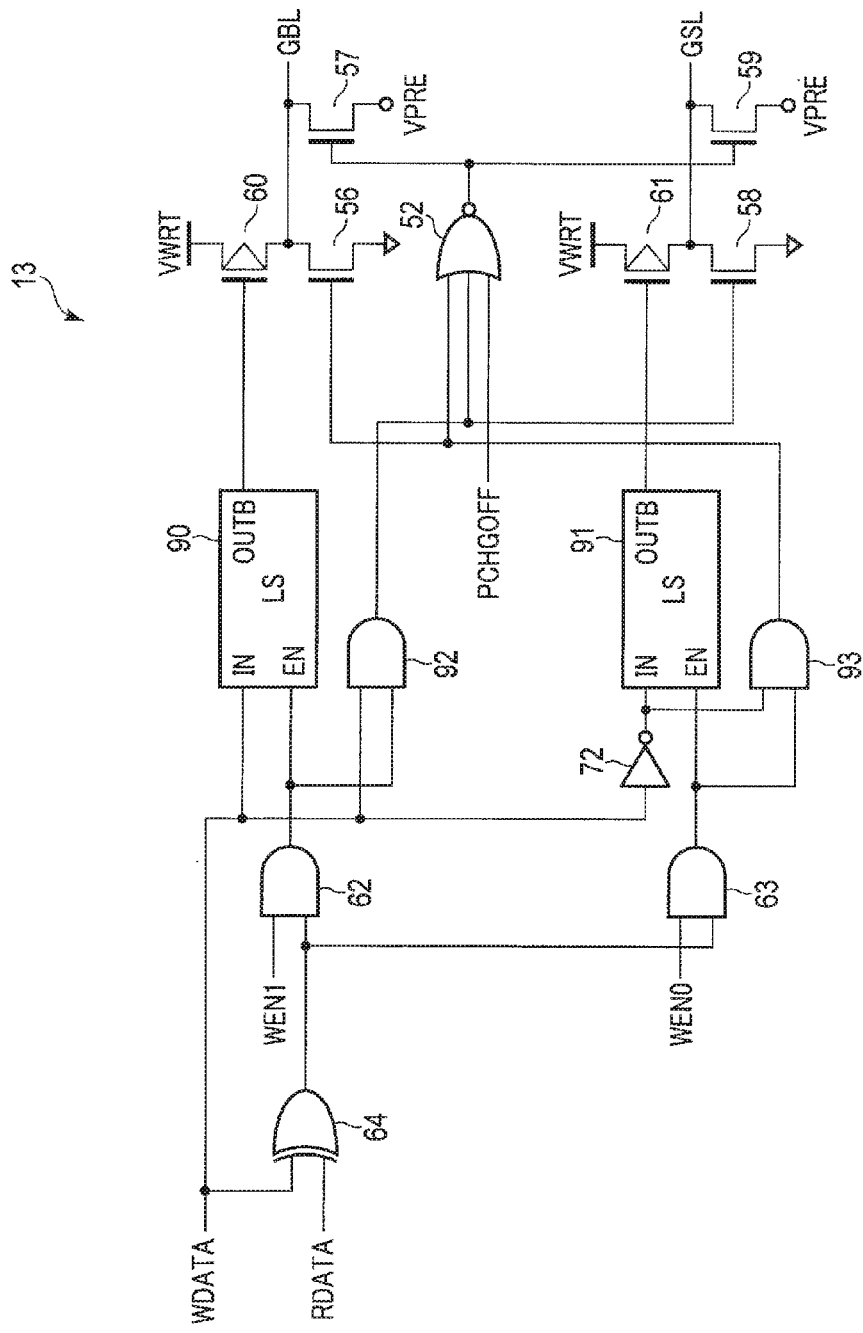
F I G. 19

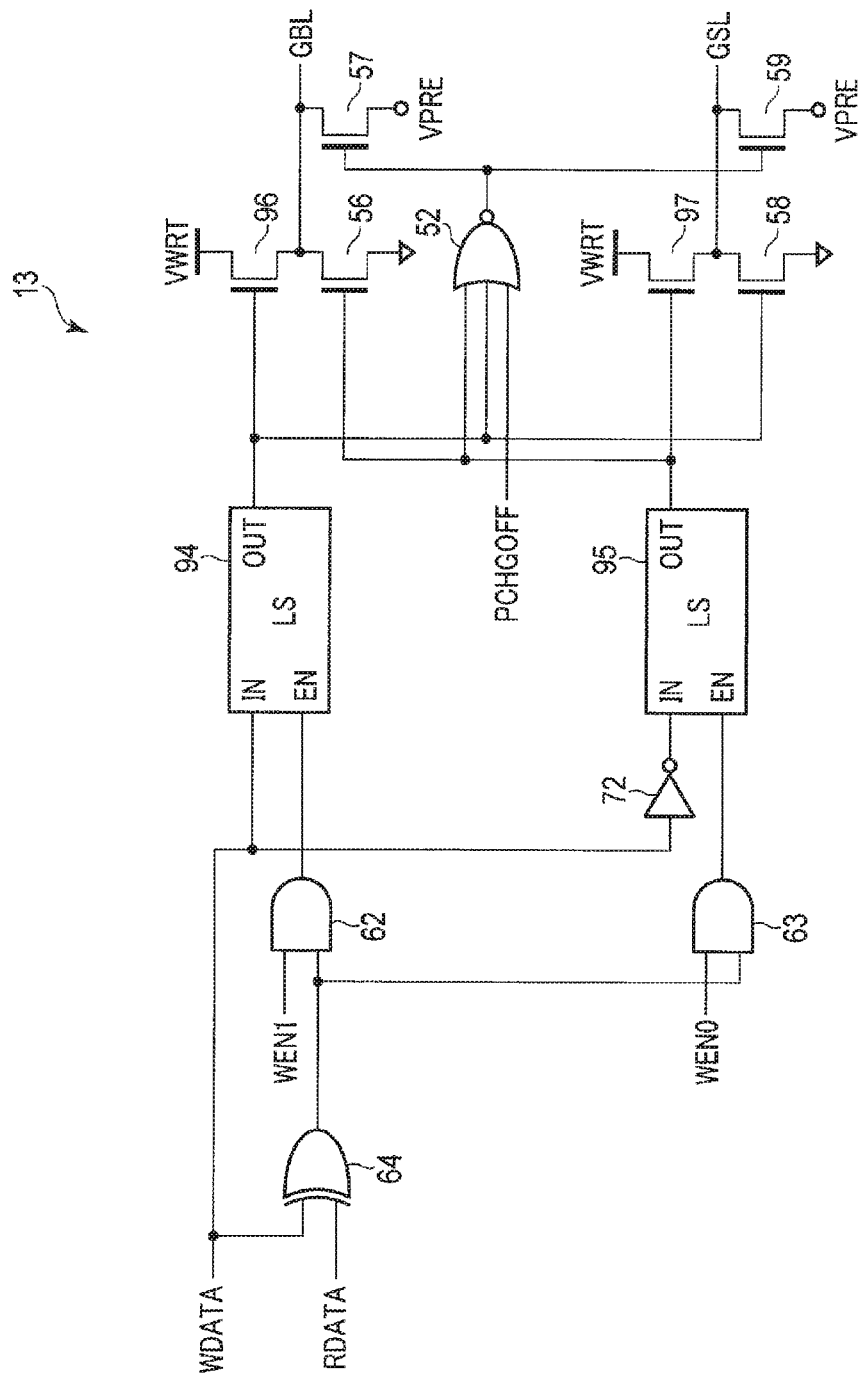
F I G. 20

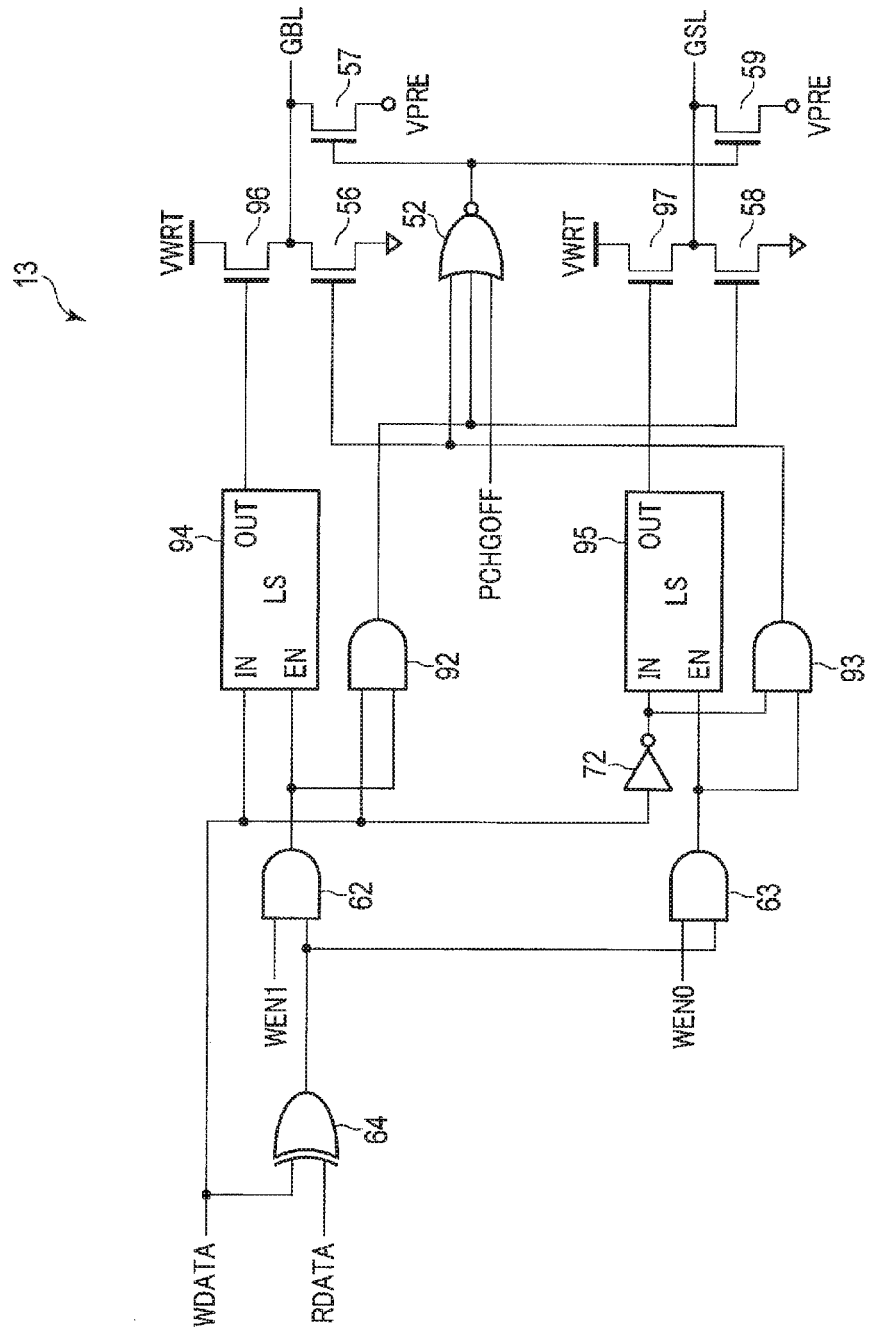
F I G. 21

SEMICONDUCTOR MEMORY DEVICE WITH WRITE DRIVER

CROSS-REFERENCE TO RELATED APPLICATIONS

This application claims the benefit of U.S. Provisional Application No. 62/394,169, filed Sep. 13, 2016, the entire contents of which are incorporated herein by reference.

FIELD

Embodiments described herein relate generally to a semiconductor memory device.

BACKGROUND

As a type of semiconductor memory device, semiconductor memory devices having resistive random access memory are known. As a type of resistive random access memory, MRAM (magnetoresistive random access memory) is known. The MRAM is a memory device comprising magnetic elements having a magnetoresistive effect as memory cells storing information. The MRAM has been drawing attention as a next-generation memory device characterized by its high-speed operation, large capacity, and non-volatility. Research and development efforts have been made to allow the MRAM to be used as an alternative to volatile memory such as DRAM and SRAM.

BRIEF DESCRIPTION OF THE DRAWINGS

FIG. 1 is a block diagram of a semiconductor memory device according to a first embodiment;

FIG. 2 is a circuit diagram of a cell array, a first and a second column selection circuit, and a read current sink circuit which are provided in the semiconductor memory device according to the first embodiment;

FIG. 9 is a circuit diagram of a write controller provided in the semiconductor memory device according to the second embodiment;

FIG. 10 is a flowchart of a write operation in the semiconductor memory device according to the second embodiment;

FIG. 12 is a block diagram of a semiconductor memory device according to a third embodiment;

FIG. 13 is a circuit diagram of a write driver provided in the semiconductor memory device according to the third embodiment;

FIG. 14 is a flowchart of a write operation in the semiconductor memory device according to the third embodiment;

FIG. 15 is a block diagram of a semiconductor memory device according to a fourth embodiment;

FIG. 16 is a circuit diagram of a write driver provided in a semiconductor memory device according to a fifth embodiment;

FIG. 18 is a circuit diagram of a write driver provided in a semiconductor memory device according to a sixth embodiment;

FIG. 19 is a circuit diagram of a write driver provided in a semiconductor memory device according to a first modification;

FIG. 20 is a circuit diagram of a write driver provided in a semiconductor memory device according to a second modification; and FIG. 21 is a circuit diagram of a write driver provided in a semiconductor memory device according to a third modification.

DETAILED DESCRIPTION

Figure 3:
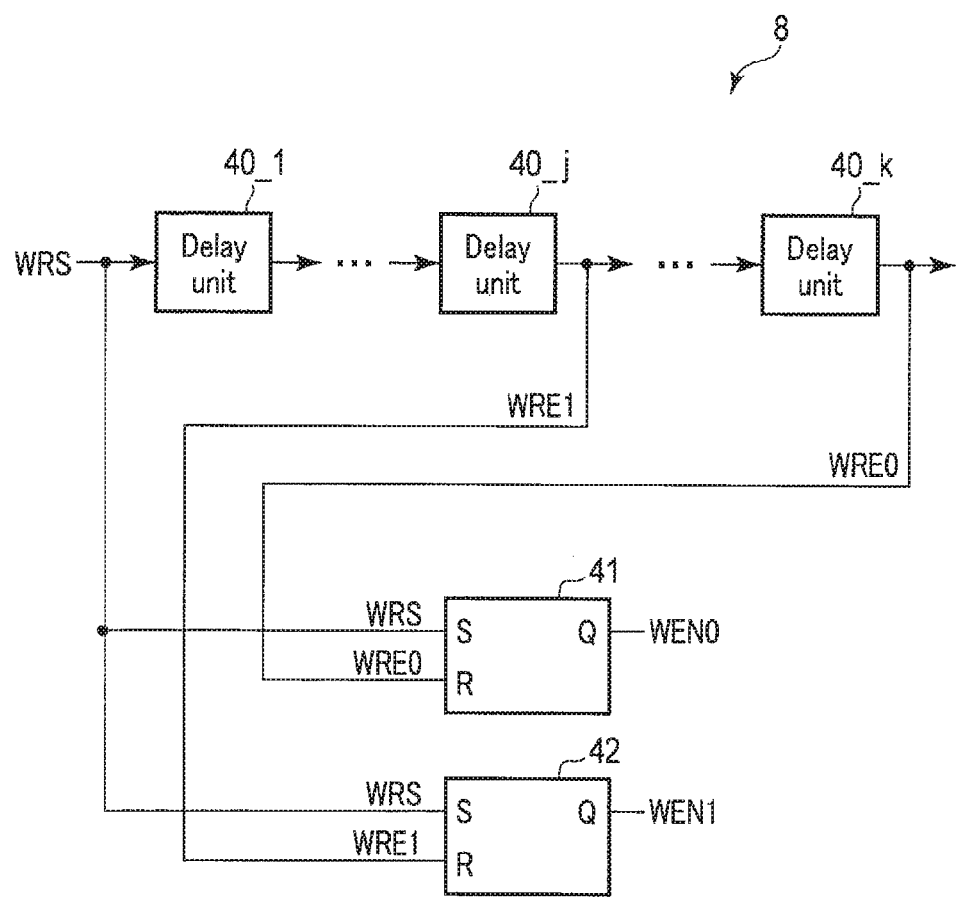
FIG. 3 is a circuit diagram of a write controller provided in the semiconductor memory device according to the first embodiment.

In general, according to one embodiment, a semiconductor memory device includes a first memory cell including a first variable resistance element and capable of storing one of first and second data, first and second lines coupled to the first memory cell, a first controller capable of simultaneously outputting a first signal which controls a first data writing and a second signal which controls a second data writing, a first driver configured to apply a first voltage to the first line and apply a second voltage different from the first voltage to the second line according to the first data and an asserted first signal in the first data writing, and apply a third voltage to the first line and apply a fourth voltage different from the third voltage to the second line according to the second data and an asserted second signal in the second data writing.

1 First Embodiment

A semiconductor memory device according to a first embodiment will be described. In the first embodiment, an MRAM which stores data using magnetic tunnel junction elements (MTJ elements) will be described by way of example. In the description below, unless otherwise specified, the terms "connect" and "couple" include not only direct coupling but also physical or electrical coupling via any element. Furthermore, one end of a transistor represents one of a source and a drain, and the other end of the transistor represents the other of the source and the drain.

1.1 General Configuration of the Semiconductor Memory Device

First, a general configuration of a semiconductor memory device according to the present embodiment will be described.

FIG. 1 is a block diagram of the semiconductor memory device according to the first embodiment.

As depicted in FIG. 1, MRAM 1 includes a logic controller 2, a row decoder 3, column decoders 4a and 4b, and a plurality of core blocks 5. In the example in FIG. 1, one core block 5 is specifically depicted. However, the other core blocks 5 also have the same configuration. Any number of core blocks 5 may be provided. In the example illustrated in FIG. 1, some of the signal lines coupling blocks together are depicted for simplification of description.

The logic controller 2 controls the entire MRAM 1 to, for example, write or read data. The logic controller 2, for example, transmits control signals to the row decoder 3, the column decoders 4a and 4b, and the plurality of core blocks 5 to control each of the row decoder 3, the column decoders 4a and 4b, and the core blocks 5. More specifically, the logic controller 2 transmits a row decoder control signal RDC to the row decoder 3 and a column decoder control signal CDC to the column decoders 4a and 4b. Furthermore, the logic controller 2 transmits a write start signal WRS to a write controller 8 in each of the core blocks 5 and transmits a prefetch decoder control signal PDC to a prefetch decoder 9. Moreover, the logic controller 2 transmits a read sink signal RDS to a read current sink circuit 10 included in each memory unit 6 in each of the core blocks 5, and transmits a sense amplifier enable signal SEN to a sense amplifier 14.

The row decoder 3 decodes address signals ADDR received from external equipment based on a row decoder control signal RDC transmitted from the logic controller 2 to select one of word lines WL1 to WLm (m is an integer of 2 or larger). The word lines WL1 to WLm are hereinafter simply referred to as the word lines WL unless any of the word lines WL1 to WLm is described in a limited manner. For example, the row decoder 3 applies a voltage VWL to the selected word line WL, while applying a ground voltage VSS to the unselected word lines WL. The voltage VWL is a voltage which is higher than the ground voltage VSS and which turns on a cell transistor in a memory cell described below. The word lines WL are coupled to cell arrays 12 (described below in detail) in the plurality of core blocks 5.

The column decoder 4a decodes the address signals ADDR based on the column decoder control signal CDC transmitted from the logic controller 2 to select a corresponding one of first column signals CSL1_1 to CSL1_n (n is an integer of 2 or larger) according to a decode result. The first column signals CSL1_1 to CSL1_n are hereinafter simply referred to as the first column signals CSL1 unless any of the first column signals CSL1_1 to CSL1_n is described in a limited manner. For example, the column decoder 4a sets the selected first column signal CSL1 to a high level (hereinafter referred to as an ""H" level") and sets the unselected first column signals CSL1 to a low level (hereinafter referred to as a ""L" level"). The first column signals CSL1 are transmitted to respective column selection circuits 11a (described below in detail) in the plurality of core blocks 5.

Like the column decoder 4a, the column decoder 4b decodes the address signals ADDR based on the column decoder control signal CDC transmitted from the logic controller 2 to select a corresponding one of second column signals CSL2_1 to CSL2_n according to a decode result. The second column signals CSL2_1 to CSL2_n are hereinafter simply referred to as the second column signals CSL2 unless any of the second column signals CSL2_1 to CSL2_n is described in a limited manner. For example, the column decoder 4b sets the selected second column signal CSL2 to the "H" level" and sets the unselected second column signals CSL2 to the "L" level. The first column signals CSL1_1 to CSL1_n correspond to the second column signals CSL2_1 to CSL2_n, respectively, on a one-to-one basis. For example, when the column decoder 4a selects the first column signal CSL1_1, the column decoder 4b selects the second column signal CSL2_1. The first column signal CSL1 and the second column signal CSL2 are hereinafter simply referred to as the column signals CSL unless one of the first column signal CSL1 and the second column signal CSL2 is described in a limited manner. Furthermore, the column decoders 4a and 4b are simply referred to as the column decoders 4 unless one of the column decoders 4a and 4b is described in a limited manner. The second column signals CSL2 are transmitted to respective second column selection circuit 11b (described below in detail) in the plurality of core blocks 5.

Each of the core blocks 5 includes a plurality of memory units 6, a plurality of data buffers 7, a write controller 8, and the prefetch decoder 9. In an example in FIG. 1, one memory unit 6 is specifically depicted, and the other memory units 6 also have the same configuration. In the present embodiment, a case will be described in which, in the core block 5, memory units 6 are provided the number of which corresponds to a unit of data (hereinafter referred to as a "prefetch unit") continuously transferred for one set of address signals ADDR. For example, when the length of data (burst length) continuously transferred for one set of address signals ADDR is 4 bits and 16 bit lines are used to output and receive data to and from external equipment (not depicted in the drawings), the prefetch unit is 4×16=64 bits. Therefore, the core block 5 includes 64 memory units 6. Any number of memory units 6 may be provided. Furthermore, the data buffers 7 correspond to the memory units 6, and for example, the number of the data buffers 7 provided is the same as the number of the memory units 6 provided.

Each of the memory units 6 is provided in association with write or read of 1-bit data. The memory unit 6 includes the read current sink circuit 10, the first column selection circuit 11a, the second column selection circuit 11b, a cell array 12, a write driver 13, and the sense amplifier 14.

The cell array 12 includes a plurality of memory cells (described below in detail) two-dimensionally arranged in a matrix. Data is saved to the cell array 12 in a nonvolatile manner. The cell array 12 is coupled to the row decoder 3 via m word lines WL. Furthermore, the cell array 12 is coupled to the first column selection circuit 11a via n bit lines BL1 to BLn. Moreover, the cell array 12 is also coupled to the second column selection circuit 11b via n source lines SL1 to SLn. The bit lines BL1 to BLn are hereinafter simply referred to as the bit lines BL unless any of the bit lines BL1 to BLn is described in a limited manner. Similarly, the source lines SL1 to SLn are simply referred to as the source lines SL unless any of the source lines SL1 to SLn is described in a limited manner.

More specifically, in the cell array 12, m word lines WL are arranged in a row direction, and n bit lines BL and n source lines SL are arranged in a column direction. Any number of memory cells may be provided.

The first column selection circuit 11a selects one of the bit lines BL in accordance with the first column signal CSL1 transmitted from the column decoder 4a to couple the selected bit line BL to a global bit line GBL. More specifically, the first column signals CSL1_1 to CSL1_n are provided in association with the bit lines BL1 to BLn, respectively. For example, when the first column signal CSL1_1 is at the "H" level, the first column selection circuit 11a selects the bit line BL1. The first column selection circuit 11a couples the global bit line GBL and the selected bit line BL1 together.

The second selection circuit 11b selects one of the source lines SL in accordance with the second column signal CSL2 transmitted from the column decoder 4b to couple the selected source line SL to a global source line GSL. More specifically, the second column signals CSL2_1 to CSL2_n are provided in association with the source lines SL1 to SLn, respectively. For example, when the second column signal CSL2_1 is at the "H" level, the second column selection circuit 11b selects the source line SL1. The second column selection circuit 11b couples the global source line GSL and the selected source line SL1 together. The first column selection circuit 11a and the second column selection circuit 11b are hereinafter simply referred to as the column selection circuits 11 unless one of the first column selection circuit 11a and the second column selection circuit 11b is described in a limited manner.

The write driver 13 applies a write voltage VWRT (for example, a power supply voltage VDD) supplied by an external power supply or a voltage generator (not depicted in the drawings) to one of the global bit line GBL and the global source line GSL in accordance with write enable signals WEN0 and WEN1 transmitted from the write controller 8 and write data WDATA transferred from the data buffer 7, while grounding the other of the global bit line GBL and the global source line GSL (applying a ground voltage VSS to the other). The write enable signal WEN0 is a signal which controls write of "0" data. The write enable signal WEN1 is a signal which controls write of "1" data. The write voltage VWRT is a voltage which is applied to a variable resistance element (memory element) included in the memory cell during data write. During data write, the write voltage VWRT is applied between the global bit line GBL and the global source line GSL to pass a write current through the variable resistance element (memory element) electrically coupled to the global bit line GBL and the global source line GSL.

More specifically, for example, the write enable signals WEN0 and WEN1 are asserted at the "H" level. When the write data WDATA is "1" data and the write enable signal WEN1 is at the "H" level, the write driver 13 applies the write voltage VWRT to the global bit line GBL, while applying the voltage VSS to the global source line GSL. On the other hand, when the write data WDATA is "0" and the write enable signal WEN0 is at the "H" level, the write driver 13 applies the write voltage VWRT to the global source line GSL, while applying the voltage VSS to the global bit line GBL.

During data read, the read current sink circuit 10 sinks a read current through the global source line GSL based on the signal RDS transmitted from the logic controller 2. The read current is a current passed through the variable resistance element by applying a read voltage to the variable resistance element. More specifically, the read current sink circuit 10 grounds the global source line GSL.

The sense amplifier 14 reads data stored in the memory cell in accordance with the sense amplifier enable signal SEN transmitted from the logic controller 2. Furthermore, the sense amplifier 14 transfers read data RDATA to the data buffer 7.

Each data buffer 7 ("Data buffer (1 bit)" in FIG. 1) is provided for the corresponding memory unit 6. The data buffer 7 holds 1-bit data and transmits and receives data to and from the corresponding memory unit 6. More specifically, in data write, the data buffer 7 holds and transfers the 1-bit write data WDATA received from the external equipment to the write driver 13 in the corresponding memory unit 6. In data read, the data buffer 7 holds and transfers the 1-bit read data RDATA read by the sense amplifier 14 to the external equipment.

The write controller 8 controls the write enable signals WEN0 and WEN1 based on a write start signal WRS transmitted from the logic controller 2 and a signal PTW transmitted from the prefetch decoder 9 and transmits the write enable signals WEN0 and WEN1 to the write driver 13 in each memory unit 6. The write controller 8 in the present embodiment can switch the "H"/"L" level of the write enable signals WEN0 and WEN1 at same timing or at different timings.

The prefetch decoder 9 decodes the address signals ADDR based on the prefetch decoder control signal PDC transmitted from the logic controller 2. For example, the prefetch decoder 9 switches between the "L" level and "H" level of the signal PTW when the corresponding core block 5 is selected.

1.1.1 Configurations of the Cell Array, the First and Second Column Select Circuits, and the Read Current Sink Circuit Now, the configurations of the first column selection circuit 11a and the second column selection circuit 11b, and the read current sink circuit 10 will be described.

FIG. 2 is a circuit diagram of the cell array 12, the first column selection circuit 11a and the second column selection circuit 11b, and the read current sink circuit 10 provided in the semiconductor memory device according to the first embodiment.

As depicted in FIG. 2, the first column selection circuit 11a includes n n-channel MOS transistors (or referred to as "NMOS transistors") 21, for example. The n transistors 21 are provided for the corresponding n bit lines BL1 to BLn.

More specifically, one ends of the n transistors 21 are coupled in common to the global bit line GBL. The other ends of the n transistors 21 are coupled to the bit lines BL1 to BLn, respectively. The first column signals CSL1_1 to CSL1_n are input to gates of the respective n transistors 21. Therefore, each of the transistors 21 functions as a switching element that couples the corresponding bit line BL and the global bit line GBL together in accordance with the first column signal CSL1.

Like the first column selection circuit 11a, the second column selection circuit 11b includes n n-channel MOS transistors, for example. The n transistors 22 are provided for the corresponding n source lines SL1 to SLn.

More specifically, one ends of the n transistors 22 are coupled in common to the global source line GSL. Other ends of the n transistors 22 are coupled to the source lines SL1 to SLn, respectively. The second column signals CSL2_1 to CSL2_n are input to gates of the respective n transistors 22. Therefore, each of the transistors 22 functions as a switching element that couples the corresponding source line SL and the global source line GSL together in accordance with the second column signal CSL2.

The cell array 12 includes a plurality of memory cells MC two-dimensionally arranged in a matrix. Each of the memory cells MC includes a variable resistance element 30 and a cell transistor 20.

The variable resistance element 30 is, for example, an MTJ (Magnetic tunnel junction) element. When a write current is applied to the MTJ element, a magnetic alignment in the MTJ element is varied to vary a resistance value of the MTJ element. Additionally, the variable resistance element 30 is not limited to the MTJ element but may be a resistance change element, for example, a phase change element.

The cell transistor 20 is, for example, an n-channel MOS transistor. The cell transistor 20 is turned on when the memory cell MC is selected.

One end of the variable resistance element 30 is coupled to the bit line BL. The other end of the variable resistance element 30 is coupled to one end of the cell transistor 20. The other end of the cell transistor 20 is coupled to the source line SL. A gate of the cell transistor 20 is coupled to the word line WL.

For example, in the cell array 12, the gates of the cell transistors 20 in the n memory cells MC arranged in the same row are coupled in common to one of the word lines WL. Furthermore, the one ends of the variable resistance elements 30 are coupled to the different bit lines BL. The other ends of the cell transistors 20 are coupled to the different source lines SL.

Furthermore, in the cell array 12, the one ends of the variable resistance elements 30 in the m memory cells MC arranged in the same column are coupled in common to one of the bit lines BL. Furthermore, the other ends of the cell transistors 20 in the m memory cells MC are coupled in common to one of the source lines SL. The gates of the cell transistors 20 are coupled to the different word lines SL.

The bit lines BL1 to BLn correspond to the source lines SL1 to SLn on a one-to-one basis. For example, when the first column signals CSL1_1 and the corresponding second column signal CSL2_1 are selected, the corresponding transistors 21 and 22 are turned on to select the bit line BL1 and the source line SL1. Consequently, the memory cells MC arranged in the same column are selected.

The read current sink circuit 10 includes an n-channel MOS transistor 23. One end of the transistor 23 is coupled to the global source line GSL. The other end of the transistor 23 is grounded (is coupled to a ground potential interconnect). A signal RDS is input to a gate of the transistor 23. The transistor 23 functions as a switching element that grounds the global source line GSL in accordance with the signal RDS.

1.1.2 Configuration of the Write Controller

Now, a configuration of the write controller 8 will be described. In the present embodiment, a case will be described below where a period when the write enable signal WEN0 is asserted (for example, the write enable signal WEN0 is the "H" level) is longer than a period when the write enable signal WEN1 is asserted (for example, the write enable signal WEN1 is the "H" level). That is, a period when the write voltage is applied in write of "0" data (hereinafter referred to as a ""0" write period") is longer than a period when the write voltage is applied in write of "1" data (hereinafter referred to as a ""1" write period"). The length of the "0" write period and the length of the "1" write period can be optionally varied according to write characteristics of the variable resistance element 30.

FIG. 3 is a circuit diagram of the write controller 8 provided in the semiconductor memory device according to the first embodiment.

As depicted in FIG. 3, the write controller 8 includes delay units 40_1 to 40_j to 40_k (j and k are any integers satisfying 1≤j<k) and flip-flops 41 and 42. The delay units 40_1 to 40_k are simply referred to as the delay units 40 unless any of the delay units 40_1 to 40_n is described in a limited manner.

The delay units 40_1 to 40_k are coupled together in series. The signal WRS is input to an input terminal of the delay unit 40_1. The delay unit 40_j outputs a signal WRE1, and the delay unit 40_k outputs a signal WRE0. Therefore, for example, when the signal WRS switches from the "L" level to the "H" level, the signal WRE1 switches from the "L" level to the "H" level after a delay period resulting from the j delay units 40. Moreover, after a delay period resulting from the (k–j) delay units 40, the signal WRE0 switches from the "L" level to the "H" level. That is, the "L"/"H" level is switched in an order of the signal WRS, the signal WRE1, and the signal WRE0.

The flip-flop (SR flip-flop circuit) 41 has a set (S) terminal to which the signal WRS is input, a reset (R) terminal to which the signal WRE0 is input, and an output (Q) terminal through which the signal WEN0 is output. For example, the flip-flop 41 sets the signal WEN0 to the "H" level based on a rise from the "L" level to the "H" level of the signal WRS. The flip-flop 41 sets the signal WEN0 to the "L" level based on a rise from the "L" level to the "H" level of the signal WRE0.

The flip-flop (SR flip-flop circuit) 42 has an S terminal to which the signal WRS is input, an R terminal to which the signal WRE1 is input, and a Q terminal through which the signal WEN1 is output. For example, the flip-flop 42 sets the signal WEN1 to the "H" level based on the rise from the "L" level to the "H" level of the signal WRS. The flip-flop 42 sets the signal WEN1 to the "L" level in response to a rise from the "L" level to the "H" level of the signal WRE1.

1.1.3 Configuration of the Write Driver

Now, a configuration of the write driver 13 will be described.

Figure 4:
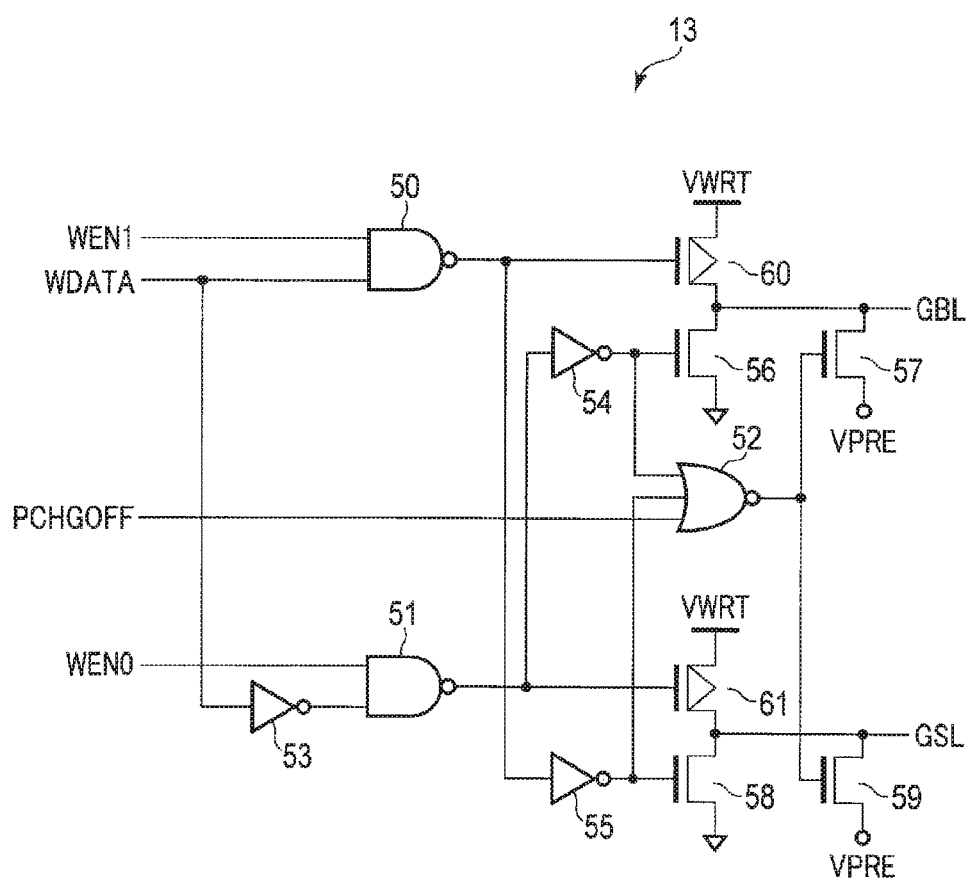
FIG. 4 is a circuit diagram of a write driver provided in the semiconductor memory device according to the first embodiment.

FIG. 4 is a circuit diagram of the write driver 13 provided in the semiconductor memory device according to the first embodiment.

As depicted in FIG. 4, the write driver 13 includes NAND circuits 50 and 51, a three-input NOR circuit 52, inverters 53 to 55, n-channel MOS transistors 56 to 59, and p-channel MOS transistors (or referred to as "PMOS" transistors) 60 and 61.

The write enable signal WEN1 is input to one input terminal of the NAND circuit 50. The write data WDATA ("0" data or "1" data) is input to the other input terminal of the NAND circuit 50. An output terminal of the NAND circuit 50 is coupled to a gate of the transistor 60 and to an input terminal of the NOR circuit 52 and a gate of the transistor 58 via the inverter 55.

The write enable signal WEN0 is input to one input terminal of the NAND circuit 51. The write data WDATA inverted by the inverter 53 is input to the other input terminal of the NAND circuit 51. An output terminal of the NAND circuit 51 is coupled to a gate of the transistor 61 and to an input terminal of the NOR circuit 52 and a gate of the transistor 56 via the inverter 54.

Inverted output signals from the NAND circuits 50 and 51 and a precharge off signal PCHOFF are input to respective three input terminals of the NOR circuit 52. The precharge off signal PCHOFF is a signal allowing control of charging (or discharging) of the global bit line GBL and the global source line GSL, and is provided by, for example, the logic controller 2. An output terminal of the NOR circuit 52 is coupled to gates of the transistor 57 and the transistor 59.

One end of the transistor 56 is grounded (for example, the ground voltage VSS is applied to the one end). The other end of the transistor 56 is coupled to one end of the transistor 60 and the global bit line GBL.

A precharge voltage VPRE is applied to one end of the transistor 57. The other end of the transistor 57 is coupled to the global bit line GBL.

One end of the transistor 58 is ground. The other end of the transistor 58 is coupled to one end of the transistor 61 and the global source line GSL.

The precharge voltage VPRE is applied to one end of the transistor 59. The other end of the transistor 59 is coupled to the global source line GSL.

The write voltage VWRT (for example, the power supply voltage VDD) is applied to the other end of each of the transistors 60 and 61.

The inverter 53 inverts the write data WDATA to output the resultant data to the NAND circuit 51.

The inverter 54 inverts the output signal from the NAND circuit 51 to output the resultant signal to the NOR circuit 52 and the gate of the transistor 56.

The inverter 55 inverts the output signal from the NAND circuit 50 to output the resultant signal to the NOR circuit 52 and the gate of the transistor 58.

A voltage other than the ground voltage VSS may be applied to the one ends of the transistors 56 and 58. For example, any voltage may be applied to the one ends of the transistors 56 and 58 so long as the voltage enables data to be written to the variable resistance element 30 and is lower than the write voltage VWRT.

Specific examples of operations of the write driver 13 will be described. For example, when the write enable signal WEN1 is at the "H" level (the write enable signal WEN0 may be either at the "H" level or at the "L" level) and the write data WDATA is "1" data ("H" level), an output from the NAND circuit 50 is at the "L" level and the transistors 58 and 60 are in an on state. On the other hand, an output from the NAND circuit 51 is at the "H" level, and the transistors 56 and 61 are in an off state. Furthermore, an output from the NOR circuit 52 is at the "L" level, and the transistors 57 and 59 are in the off state. Therefore, the write voltage VWRT is applied to the global bit line GBL via the transistor 60, and the global source line GSL is grounded via the transistor 58 (the ground voltage VSS is applied to the global source line GSL).

Furthermore, for example, when the write enable signal WEN0 is at the "H" level (the write enable signal WEN1 may be either at the "H" level or at the "L" level) and the write data WDATA is "0" data ("L" level), the output from the NAND circuit 50 is at the "H" level, and the outputs from the NAND circuit 51 and the NOR circuit 52 are at the "L" level. Therefore, the write voltage VWRT is applied to the global source line GSL via the transistor 61, and the global bit line GBL is grounded via the transistor 56 (the ground voltage VSS is applied to the global bit line GBL).

In addition, for example, when the write enable signals WEN0 and WEN1 and the precharge off signal PCHOFF is at the "L" level, the outputs from the NAND circuits 50 and 51 and the NOR circuit 52 are at the "H" level. Therefore, the transistors 57 and 59 are in the on state, and the precharge voltage VPRE is applied to each of the global bit line GBL and the global source line GSL.

1.1.4 Configuration of the MTJ Element

Now, the variable resistance element 30 will be described using FIGS. 5A, 5B, and 5C. A case where the variable resistance element 30 is an MTJ element will be described below.

Figure 5A:
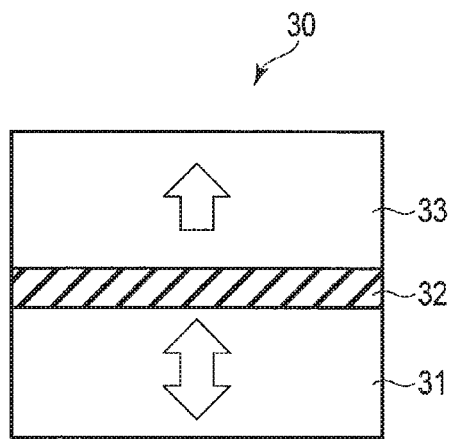
FIG. 5A is a sectional view depicting a configuration example of an MTJ element provided in the semiconductor memory device according to the first embodiment.

FIG. 5A is a sectional view depicting a configuration example of the variable resistance element 30 (MTJ element) provided in the semiconductor memory device according to the first embodiment.

As depicted in FIG. 5A, the variable resistance element 30 includes a storage layer (alternatively referred to as a free layer) 31 that is a ferromagnetic layer, a reference layer 33 that is a ferromagnetic layer, and a tunnel barrier layer 32 formed between the storage layer 31 and the reference layer 33 and which is a nonmagnetic layer.

The storage layer 31 is a ferromagnetic layer with a variable magnetization direction and has perpendicular magnetic anisotropy. Here, the perpendicular magnetic anisotropy indicates that the magnetization direction is perpendicular or substantially perpendicular to film surfaces (an upper surface and a lower surface). Furthermore, the variable magnetization direction indicates that the magnetization direction varies with respect to a predetermined write current. Additionally, "substantially perpendicular" means that the direction of residual magnetization falls within the range of $45°<\theta\leq900$. For example, the storage layer 31 is formed of CoPd (cobalt palladium), CoFeB (cobalt-iron-boron), or FeB (iron-boron).

The tunnel barrier layer 32 is provided on the storage layer 31. The tunnel barrier layer 32 is a nonmagnetic layer and is formed of, for example, MgO (magnesium oxide).

The reference layer 33 is provided on the tunnel barrier layer 32. The reference layer 33 is a ferromagnetic layer with an invariable magnetization direction and has perpendicular magnetic anisotropy. Here, the invariable magnetization direction indicates that the magnetization direction does not vary with respect to the predetermined write current. That is, the reference layer 33 has a larger reversal energy barrier for the magnetization direction than the storage layer 31. For example, the reference layer 33 is formed of CoPt (cobalt platinum), CoNi (cobalt nickel), or CoPd (cobalt palladium). The magnetization direction in the storage layer 31 and the reference layer 33 is not limited to the perpendicular direction but may be an in-plane direction. That is, the magnetization direction in the storage layer 31 and the reference layer 33 may be perpendicular to a direction in which a current flows. Moreover, the tunnel barrier layer 32 may be provided on the reference layer 33, and the storage layer 31 may be provided on the tunnel barrier layer 32.

Figure 5B:
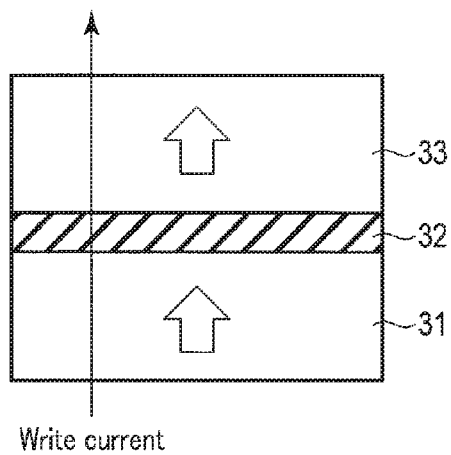
FIG. 5B is a sectional view of the MTJ element in a parallel state (low resistance state) in the semiconductor memory device according to the first embodiment.

FIG. 5B is a diagram illustrating a write operation of the MTJ element in the semiconductor memory device according to the first embodiment, and depicts a sectional view of the MTJ element in a parallel state (alternatively referred to as a "P state"). FIG. 5C is a diagram illustrating a write operation of the MTJ element in the semiconductor memory device according to the first embodiment, and depicts a sectional view of the MTJ element in an antiparallel state (alternatively referred to as an "AP state").

The variable resistance element 30 is, for example, a spin injection MTJ element. Therefore, when data is written to or read from the variable resistance element 30, a current flows through the variable resistance element 30 in opposite directions along a direction perpendicular to the film surfaces.

More specifically, data is written to the variable resistance element 30 as follows.

As depicted in FIG. 5B, when a current flows from the storage layer 31 to the reference layer 33, that is, electrons traveling from the reference layer 33 to the storage layer 31 are supplied, electrons spin-polarized in the same direction as the magnetization direction in the reference layer 33 are injected into the storage layer 31. In this case, the magnetization direction in the storage layer 31 is aligned with the magnetization direction in the reference layer 33. Consequently, the magnetization directions in the reference layer 33 and the storage layer 31 are in a parallel arrangement. In this parallel state, the variable resistance element 30 has the smallest resistance value. This case is defined, for example, as "0" data.

Figure 5C:
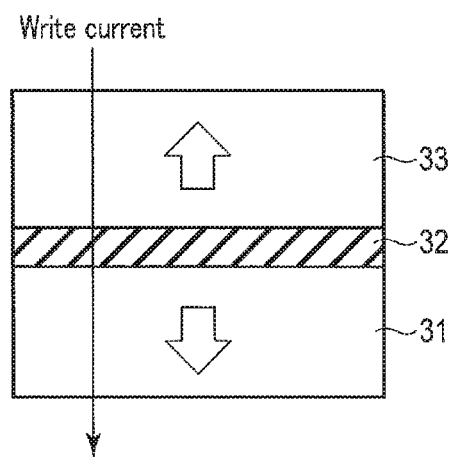
FIG. 5C is a sectional view of the MTJ element in an antiparallel state (high resistance state) in the semiconductor memory device according to the first embodiment.

On the other hand, as depicted in FIG. 5C, when a current flows from the reference layer 33 to the storage layer 31, that is, electrons traveling from the storage layer 31 to the reference layer 33 are supplied, the electrons are reflected by the reference layer 33. Consequently, electrons spin-polarized in a direction opposite to the magnetization direction in the reference layer 33 are injected into the storage layer 31. In this case, the magnetization direction in the storage layer 31 is aligned with a direction opposite to the magnetization direction in the reference layer 33. Consequently, the magnetization directions in the reference layer 33 and the storage layer 31 are in an antiparallel arrangement. In this antiparallel state, the variable resistance element 30 has the largest resistance value. This case is defined, for example, as "1" data.

Furthermore, data is read from the variable resistance element 30 as follows.

A read current is supplied to the variable resistance element 30. The read current is set to a value at which the magnetization direction in the storage layer 31 is prevented from being reversed (a value smaller than the value of the write current). The resistance value of the variable resistance element 30 at this time is detected to allow the above-described "0" data and "1" data to be read.

In the present embodiment, a composition ratio of the above-described materials (MgO, CoFeB, CoPd, FeB, CoPt, and CoNi) is not limited to 1:1 or 1:1:1. For example, when the storage layer 31 is formed of CoFeB, the storage layer 31 contains Co, Fe, and B, and the composition ratio of Co, Fe, and B is not limited. When the tunnel barrier layer 32 is formed of MgO, the tunnel barrier layer 32 contains Mg and O, and the composition ratio of Mg and O is not limited.

1.2 Write Operation

Now, the write operation will be described. In the present embodiment, a case will be described where write of "1" data and write of "0" data are started at the same timing in a prefetch unit and that the write of "1" data is completed faster than the write of "0" data. In the following description, the write of "1" data refers to a case where the write current flows to the memory cell MC through the bit line BL, and the write of "0" data refers to a case where the write current flows to the memory cell MC through the source line SL.

Alternatively, the write of "1" data may refer to the case where the write current flows to the memory cell MC through the source line SL. The write of "0" data may be completed faster than the write of "1" data. Moreover, a "1" write period may partly overlap a "0" write period. For example, the "0" data write with a long write period (write voltage application period) may be started earlier so that the write of "1" data and the write of "0" data end at the same timing.

1.2.1 General Flow of the Write Operation

First, a general flow of the write operation will be described.

Figure 6:
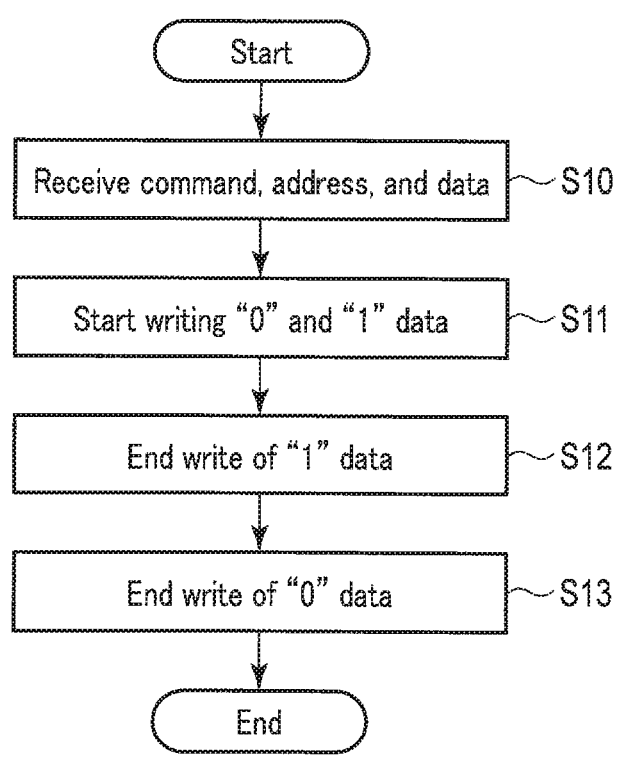
FIG. 6 is a flowchart of a write operation in the semiconductor memory device according to the first embodiment.

FIG. 6 is a flowchart of the write operation in the semiconductor memory device according to the first embodiment.

As depicted in FIG. 6, first, the MRAM 1 receives a write command, the address signals ADDR, and the write data WDATA from the external equipment (step S10). The write command is transmitted to the logic controller 2. The address signals ADDR is transmitted to the row decoder 3, the column decoders 4a and 4b, and the prefetch decoder 9. The write data WDATA is stored in the data buffer 7 on a bit-by-bit basis.

Then, the logic controller 2 starts writing "0" data and "1" data (step S11). More specifically, the row decoder 3, the column decoders 4a and 4b, and the prefetch decoder 9 in each core block 5 decode the address signals ADDR under the control of the logic controller 2. The row decoder 3 selects the corresponding word line WL. The column decoders 4a and 4b select the corresponding first column signal CSL1 and second column signal CSL2, respectively. Decoding of the address signals ADDR in each prefetch decoder 9 allows one core block 5 to be selected.

In the selected core block 5, the first column selection circuit 11a in each memory unit 6 couples the bit line BL corresponding to the selected first column signal CSL1 to the global bit line GBL. Similarly, the second column selection circuit 11b in each memory unit 6 couples the source line SL corresponding to the selected second column signal CSL2 to the global source line GSL. Furthermore, the write controller 8 sets the write enable signals WEN0 and WEN1, for example, to the "H" level, based on the signal WRS transmitted from the logic controller 2, and transmits the resultant signals WEN0 and WEN1 to the write driver 13 in each memory unit 6. Each write driver 13 applies a voltage to the global bit line GBL and the global source line GSL based on the write enable signals WEN0 and WEN1 and the write data WDATA transferred from the data buffer 7.

More specifically, when the write data WDATA is "1" data, the write driver 13 applies the write voltage VWRT to the global bit line GBL and grounds the global source line GSL. On the other hand, when the write data WDATA is "0" data, the write driver 13 applies the write voltage VWRT to the global source line GSL and grounds the global bit line GBL.

When the write voltage VWRT is applied (the write current is supplied) to the write target memory cell MC through the bit line BL via the first column selection circuit 11a, "1" data is written to the memory cell MC. On the other hand, when the write voltage VWRT is applied (the write current is supplied) to the memory cell MC through the source line SL via the second column selection circuit 11b, "0" data is written to the memory cell MC.

Then, the write controller 8 ends the write of "1" data (step S12). More specifically, the write controller 8 sets the write enable signal WEN1 to the "L" level. If the write data WDATA is "1" data, then in the corresponding memory unit 6, the transistors 56, 58, 60, and 61 in the write driver 13 are in the off state. This allows cutoff of application of the write voltage VWRT to the global bit line GBL and application of the voltage VSS to the global source line GSL. On the other hand, the transistor 57 and the transistor 59 are in the on state, and thus, the precharge voltage VPRE is applied to the global bit line GBL and the global source line GSL.

Then, the write controller 8 ends the write of "0" data (step S13). More specifically, the write controller 8 sets the write enable signal WEN0 to the "L" level. If the write data WDATA is "0" data, then in the corresponding memory unit 6, the transistors 56, 58, 60, and 61 in the write driver 13 are in the off state. This allows cutoff of application of the write voltage VWRT to the global source line GSL and application of the voltage VSS to the global bit line GBL. On the other hand, the transistor 57 and the transistor 59 are in the on state, and thus, the precharge voltage VPRE is applied to the global bit line GBL and the global source line GSL. Consequently, the write operation ends.

1.2.2 Voltages of Nodes in the Write Operation

Now, the voltages of nodes in the write operation will be described.

Figure 7:
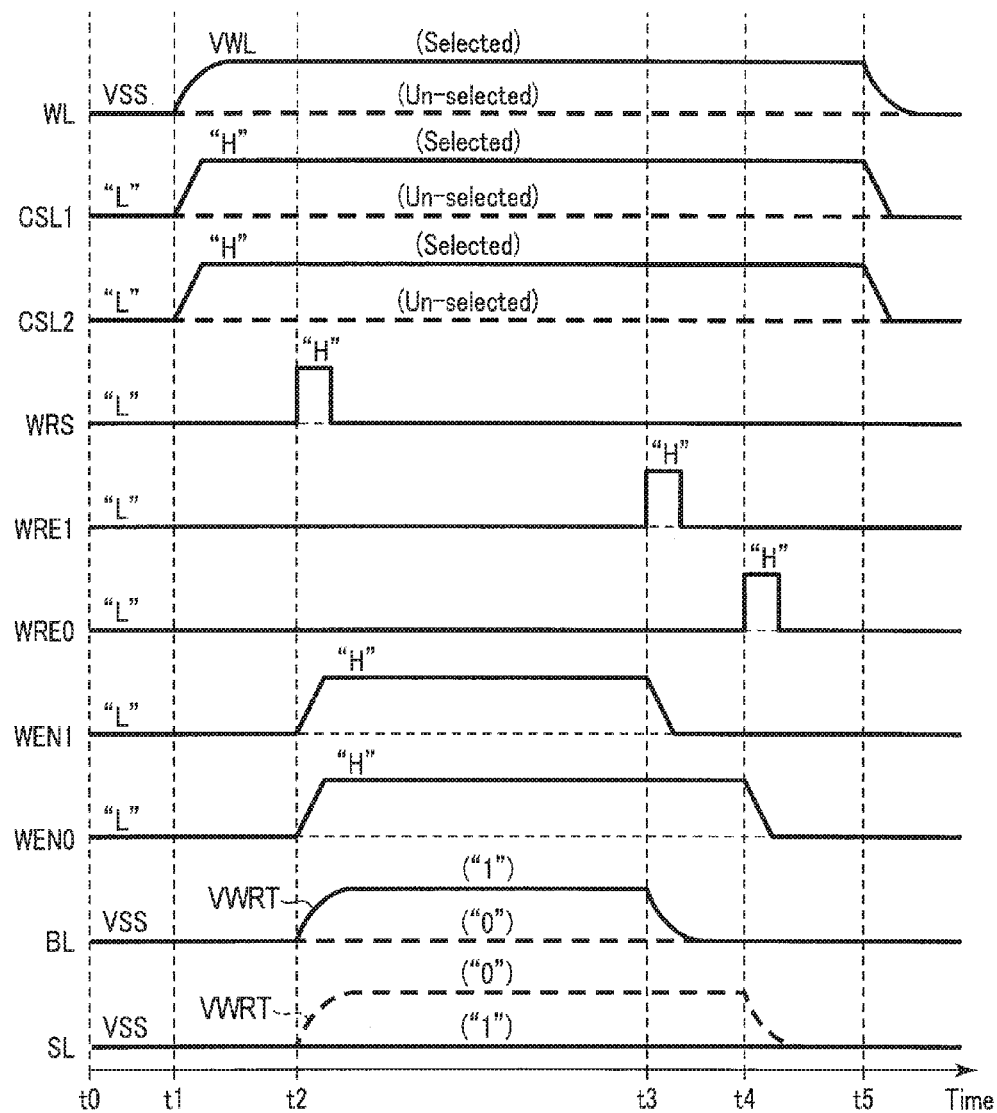
FIG. 7 is a timing chart illustrating voltages of nodes during the write operation in the semiconductor memory device according to the first embodiment.

FIG. 7 is a timing chart illustrating the voltages of nodes during the write operation in the semiconductor memory device according to the first embodiment.

As depicted in FIG. 7, time t0 corresponds to a state before the start of the write operation. The voltage VSS is applied to the word lines WL, the bit lines BL, and the source lines SL, and the first column signals CSL1, the second column signals CSL2, the write start signal WRS, the signals WRE1 and WRE0 and the write enable signals WEN0 and WEN1 in the write controller 8 are at the "L" level.

At time t1, the write operation is started. The row decoder 3 applies the voltage VWL to the selected word line WL. Furthermore, the row decoder 3 applies the voltage VSS to the unselected word lines WL. The column decoders 4a and 4b set the selected first column signal CSL1 and the selected second column signal CSL2 to the "H" level, respectively.

At time t2, the logic controller 2 applied a pulse voltage at the "H" level to the write start signal WRS. The write controller 8 in the selected core block 5 sets the write enable signals WEN0 and WEN1 to the "H" level at the timing of a rise from the "L" level to the "H" level of the write start signal WRS. The write driver 13 corresponding to the write of "1" data applies the write voltage VWRT (for example, the power supply voltage VDD) to the selected bit line BL via the global bit line GBL and the first column selection circuit 11a, and applies the ground voltage VSS to the selected source line SL via the global source line GSL and the second column selection circuit 11b. On the other hand, the write driver 13 corresponding to the write of "0" data applies the write voltage VWRT to the selected source line SL via the global source line GSL and the second column selection circuit 11b, and applies the voltage VSS to the selected bit line BL via the global bit line GBL and the first column selection circuit 11a.

At time t3, the write controller 8 applies a pulse voltage at the "H" level to the signal WRE1 and sets the write enable signal WEN1 to the "L" level at the timing of a rise from the "L" level to the "H" level of the signal WRE1. The write driver 13 corresponding to the write of "1" data applies the precharge voltage VPRE (in this case, the precharge voltage VPRE and the ground voltage VSS are identical (VPRE=VSS)) to the selected bit line BL.

At time t4, the write controller 8 applies a pulse voltage at the "H" level to the signal WRE0 and sets the write enable signal WEN0 to the "L" level at the timing of a rise from the "L" level to the "H" level of the signal WRE0. The write driver 13 corresponding to the write of "0" data applies the precharge voltage VPRE (in this case, VPRE=VSS) to the selected source line SL.

At time t5, the row decoder 3 applies the voltage VSS to the selected word line WL, and the column decoders 4a and 4b set the first column signals CSL1 and the second column signals CSL2 to the "L" level, respectively. Consequently, the write operation ends.

1.3 Effects Relating to the Present Embodiment

When data is written to the variable resistance element (storage element), for example, the resistance value (low resistance/high resistance) of the variable resistance element is varied according to the direction of a current flowing through the variable resistance element to allow "1" or "0" data to be stored. A voltage or current application period (hereinafter referred to as a "write period") needed to shift the variable resistance element from a low resistance state to a high resistance state is often different from a write period needed to shift the variable resistance element from the high resistance state to the low resistance state. In general, when "1" and "0" data are simultaneously written to a plurality of memory cells, the write period for the variable resistance element is determined depending on the write with a longer write period needed for the shift of the resistance state. In this case, a surplus voltage is applied (a surplus current is supplied) to the variable resistance element to which data not needing a long write period is written. This degrades reliability of the variable resistance element, for example, TDDB (Time dependent dielectric breakdown), or endurance to data rewrite.

Furthermore, when the write of "1" data and the write of "0" data are executed during different periods in order to suppress degradation of reliability of the variable resistance element, a processing period for the write operation increases to deteriorate the processing capability of the semiconductor memory device.

In contrast, the configuration according to the present embodiment includes the write driver 13 operating based on the write data WDATA ("1"/"0" data), the write enable signal WEN1 corresponding to the "1" data write and the write enable signal WEN0 corresponding to the "0" data write. For the "1" data write, the write driver 13 supplies the write current to the variable resistance element 30 by applying the write voltage VWRT to the global bit line GBL and applying the voltage VSS to the global bit line GSL, in accordance with the write enable signal WEN1. On the other hand, for the "0" data write, the write driver 13 supplies the write current to the variable resistance element 30 by applying the voltage VSS to the global bit line GBL and applying the write voltage VWRT to the global bit line GSL, in accordance with the write enable signal WEN0. Therefore, the write driver 13 enables the write period for "1" data and the write period for "0" data to be set to different lengths. That is, the write driver 13 allows the write voltage VWRT to be applied to the variable resistance element 30 during an optimal write period corresponding to the "1" data and "0" data. This allows flow of an excessive write current to the variable resistance element 30 to be suppressed to prevent the degradation of the variable resistance element 30. Therefore, reliability of the semiconductor memory device can be enhanced.

Moreover, the configuration according to the present embodiment allows provision of the optimal write period corresponding to the "1" data and "0" data, and thus enables a reduction in write error rate. Therefore, reliability of the semiconductor memory device can be enhanced.

Moreover, the configuration according to the present embodiment is provided with one write drivers 13 each corresponding to 1 bit data. Thus, when data of a plurality of bits containing "1" data and "0" data is written, at least a part of the write period for "1" data can be overlapped with at least a part of the write period for "0" data. More specifically, for example, the write of "1" data and the write of "0" data may be started at the same timing, and the write of "1" data may be completed earlier than the write of "0" data. Therefore, a possible increase in the processing time for the write operation can be suppressed. Therefore, the processing capability of the semiconductor memory device can be prevented from being deteriorated.

Moreover, the write driver 13 can apply the write voltage VWRT during the optimal write period corresponding to the "1" data or "0" data. Therefore, power consumption of the write operation can be suppressed. This allows a possible increase in the power consumption of the semiconductor memory device to be suppressed.

2 Second Embodiment

Now, a second embodiment will be described. In the second embodiment, the write operation is performed in a plurality of core blocks 5 at a time. Furthermore, the second embodiment is different from the first embodiment in the pattern of the "1" write period and the "0" write period. Only the differences from the first embodiment will be described below.

2.1 General Configuration of the Semiconductor Memory Device

First, a general configuration of the semiconductor memory device according to the present embodiment will be described.

Figure 8:
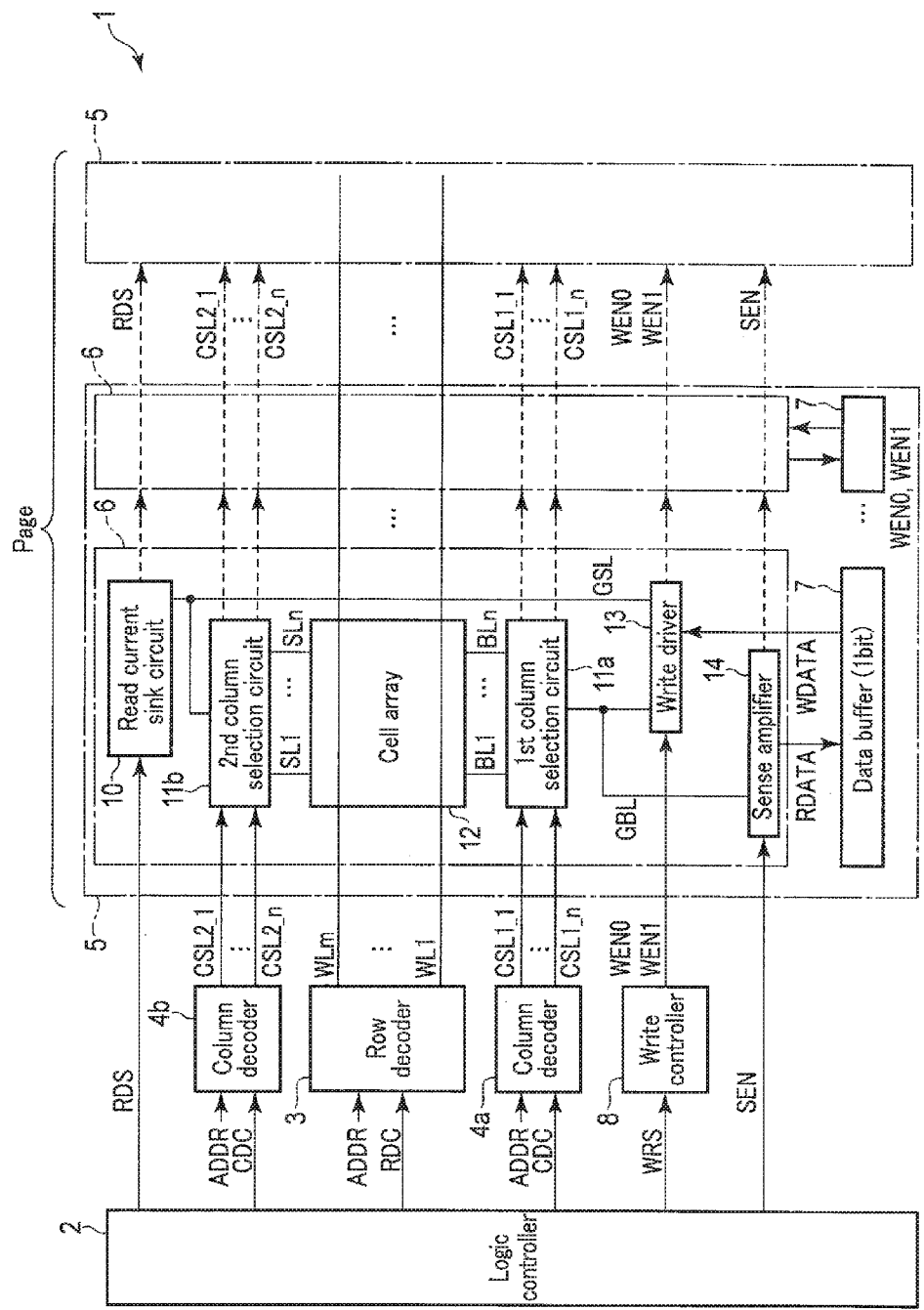
FIG. 8 is a block diagram of a semiconductor memory device according to a second embodiment.

FIG. 8 is a block diagram of the semiconductor memory device according to the present embodiment.

As depicted in FIG. 8, the write controller 8 in the present embodiment controls the write drivers 13 in the plurality of core blocks 5. More specifically, the write controller 8 controls the write enable signals WEN0 and WEN1 based on the write start signal WRS transmitted from the logic controller 2 to transmit the write enable signals WEN0 and WEN1 to the write driver 13 in each of the core blocks 5. A data write operation or a data read operation is performed, at a time, in the plurality of core blocks 5 coupled in common to the one write controller 8. A unit of data on which write or read is executed at a time is hereinafter referred to as a page. Therefore, one page of data contains a plurality of prefetch units of data.

Furthermore, in an example in FIG. 8, the write controller 8 provided in the core block 5 as depicted in FIG. 1 for the first embodiment is discarded. Moreover, in the example in FIG. 8, the prefetch decoder 9 is omitted.

The prefetch decoder (not depicted in the drawings) may control loading of the write data WDATA into the data buffer 7.

2.2 Configuration of the Write Controller

Now, a configuration of the write controller 8 will be described. As described below, in the present embodiment, the write of "0" data and the write of "1" data are started at the same time. The write of "0" data is temporarily ended, and then, the write of "1" data is ended. Subsequently, the only the write of "0" data is executed again. This case will be described.

FIG. 9 is a circuit diagram of the write controller 8 provided in the semiconductor memory device according to the second embodiment.

As depicted in FIG. 9, the write controller 8 includes delay units 40_1 to 40_h to 40_i to 40_j to 40_k(h, i, j, k are any integers satisfying 1≤h<i<j<k), flip-flops 41 and 42, and OR circuits 43 and 44.

The delay units 40_1 to 40_k are coupled together in series, and the signal WRS is input to an input terminal of the delay unit 40_1. The delay units 40_h, 40_i, 40_j, and 40_k output signals WRE0A, WRE1, WRS0B, and WRE0B, respectively. Therefore, for example, when the signal WRS switches from the "L" level to the "H" level, after a delay period corresponding to the number of the delay units 40, the signals WRE0A, WRE1, WRS0B, and WRE0B switches from the "L" level to the "H" level in order.

The signal WRS and the signal WRS0B are input to the OR circuit 43, and an output terminal of the OR circuit 43 is coupled to an S terminal of the flip-flop 41.

The signal WRE0A and the signal WRE0B are input to the OR circuit 44, and an output terminal of the OR circuit 44 is coupled to an R terminal of the flip-flop 41.

Output of the write enable signals WEN0 and WEN1 will be described below in brief.

For example, when the logic controller 2 applies a pulse voltage at the "H" level to the signal WRS, the OR circuit 43 outputs an "H" level signal during a period when the signal WRS is to be at the "H" level. The flip-flop 41 sets the write enable signal WEN0 to the "H" level in response to a rise from the "L" level to the "H" level of the input signal to the S terminal. Similarly, the signal WRS at the "H" level is input to an S terminal of the flip-flop 42, and thus, the flip-flop 42 sets the write enable signal WEN1 to the "H" level in response to a rise from the "L" level to the "H" level of the input signal to the S terminal.

Then, after a delay period corresponding to the h delay units 40, the OR circuit 44 outputs an "H" level signal during a period when the signal WRE0A is to be at the "H" level. The flip-flop 41 sets the write enable signal WEN0 to the "L" level in response to a rise from the "L" level to the "H" level of the input signal to an R terminal.

Then, after a delay period corresponding to the (i-h) delay units 40, the signal WRE1 at the "H" level is input to an R terminal of the flip-flop 42, and thus, the flip-flop 42 sets the write enable signal WEN1 to the "L" level in response to a rise from the "L" level to the "H" level of the signal WRE1.

Then, after a delay period corresponding to the (j–i) delay units 40, the OR circuit 43 outputs an "H" level signal during a period when the signal WRS0B is to be at the "H" level. The flip-flop 41 sets the write enable signal WEN0 to the "H" level in response to a rise from the "L" level to the "H" level of the input signal to the S terminal.

Then, after a delay period corresponding to the (k–j) delay units 40, the OR circuit 44 outputs an "H" level signal during a period when the signal WRE0B is to be at the "H" level. The flip-flop 41 sets the write enable signal WEN0 to the "L" level in response to a rise from the "L" level to the "H" level of the input signal to the R terminal.

2.3 General Flow of the Write Operation

Now, a general flow of the write operation will be described.

FIG. 10 is a flowchart of the write operation in the semiconductor memory device according to the second embodiment.

As illustrated in FIG. 10, first, the MRAM 1 receives the write command, the address signals ADDR, and the write data WDATA from the external equipment (step S20). The write command is transmitted to the logic controller 2. The address signals ADDR is transmitted to the row decoder 3 and the column decoders 4a and 4b. The write data WDATA is stored in the data buffer 7 on a bit-by-bit basis.

Then, the logic controller 2 starts writing "0" data and "1" data (step S21). More specifically, the row decoder 3 and the column decoders 4a and 4b decode the address signals ADDR under the control of the logic controller 2. The row decoder 3 selects the corresponding word line WL. The column decoders 4a and 4b select the corresponding first column signal CSL1 and second column signal CSL2, respectively.

In each core block 5, the first column selection circuit 11a couples the bit line BL corresponding to the selected first column signal CSL1 to the global bit line GBL. Similarly, the second column selection circuit 11b couples the source line SL corresponding to the selected second column signal CSL2 to the global source line GSL.

The write controller 8 sets the write enable signals WEN0 and WEN1, for example, to the "H" level, based on the signal WRS transmitted from the logic controller 2, and transmits the resultant signals WEN0 and WEN1 to the write driver 13 in each core block 5. The write driver 13 applies a voltage to the global bit line GBL and the global source line GSL based on the write enable signals WEN0 and WEN1 and the write data WDATA transferred from the data buffer 7.

Then, the write controller 8 ends the write of "0" data (step S22). More specifically, the write controller 8 sets the write enable signal WEN0 to the "L" level. In the memory unit 6 corresponding to the write of "0" data, the write driver 13 ends application of the write voltage VWRT to the global source line GSL and application of the voltage VSS to the global bit line GBL.

Then, the write controller 8 ends the write of "1" data (step S23). More specifically, the write controller 8 sets the write enable signal WEN1 to the "L" level. In the memory unit 6 corresponding to the write of "1" data, the write driver 13 ends application of the write voltage VWRT to the global bit line GBL and application of the voltage VSS to the global source line GSL.

Then, the write controller 8 starts the second "0" data write (step S24). More specifically, the write controller 8 sets the write enable signal WEN0 to the "H" level. In the memory unit 6 corresponding to the write of "0" data, the write voltage VWRT is applied to the global source line GSL, and the voltage VSS is applied to the global bit line GBL.

Then, the write controller 8 ends the second "0" data write (step S25). More specifically, the write controller 8 sets the write enable signal WEN0 to the "L" level. In the memory unit 6 corresponding to the write of "0" data, the write driver 13 ends application of the write voltage VWRT to the global source line GSL and application of the voltage VSS to the global bit line GBL. Consequently, the write operation ends.

2.4 Voltages of Nodes in the Write Operation

Now, the voltages of nodes in the write operation will be described.

Figure 11:
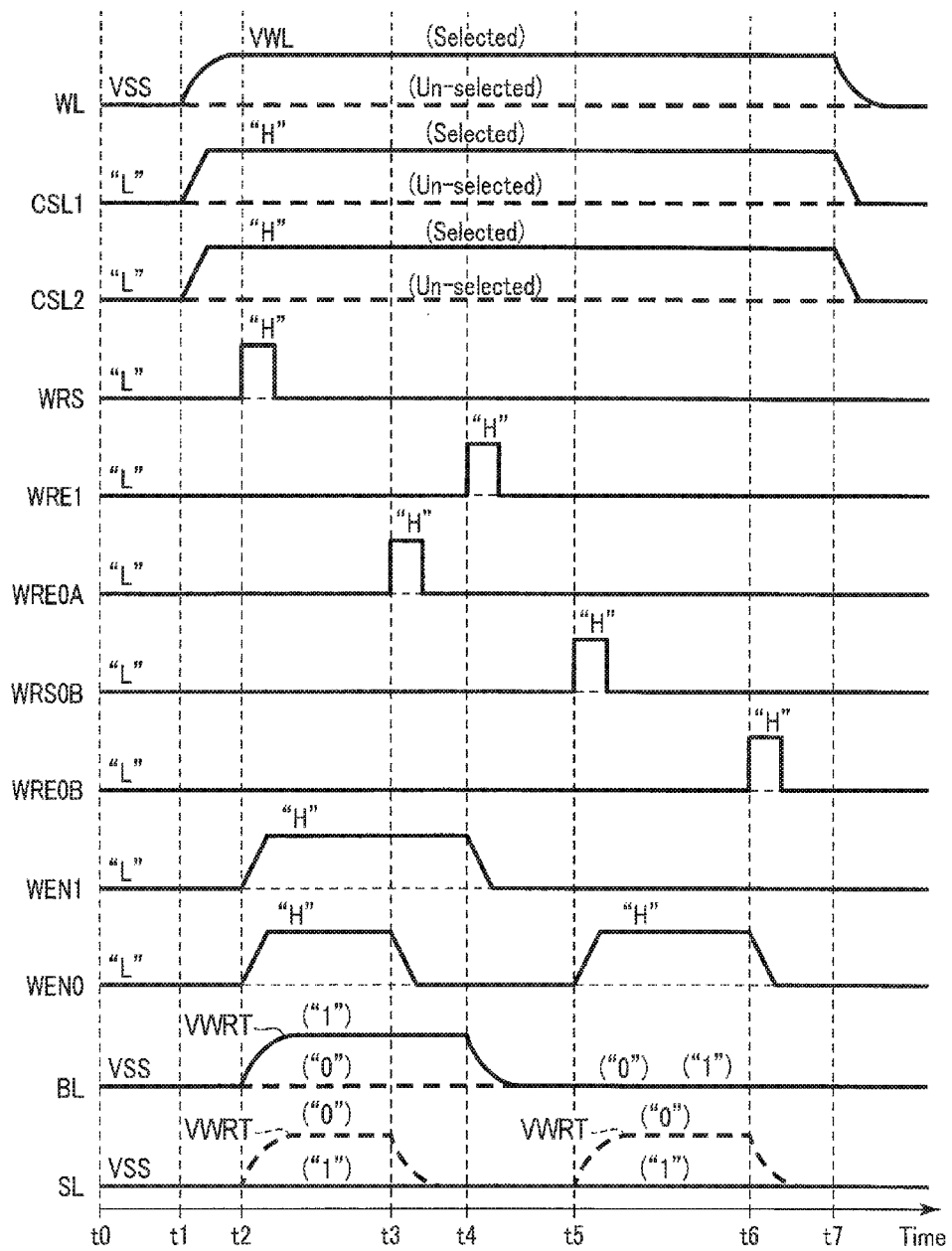
FIG. 11 is a timing chart illustrating voltages of nodes during the write operation in the semiconductor memory device according to the second embodiment.

FIG. 11 is a timing chart illustrating the voltages of nodes during the write operation in the semiconductor memory device according to the second embodiment.

As depicted in FIG. 11, time t0 corresponds to a state before the start of the write operation. The signals WRE1 and WRE0A, WRS0B, WRE0B in the write controller 8 are at the "L" level.

Operations at time t1 and time t2 are the same as the corresponding operations in FIG. 7 for the first embodiment.

At time t3, the write controller 8 applies a pulse voltage at the "H" level to the signal WRE0A and sets the write enable signal WEN0 to the "L" level at the timing of a rise from the "L" level to the "H" level of the signal WRE0A. The write driver 13 corresponding to the write of "0" data applies the precharge voltage VPRE (in this case, VPRE=VSS) to the selected source line BL.

At time t4, the write controller 8 applies a pulse voltage at the "H" level to the signal WRE1 and sets the write enable signal WEN1 to the "L" level at the timing of a rise from the "L" level to the "H" level of the signal WRE1. The write driver 13 corresponding to the write of "1" data applies the precharge voltage VPRE (in this case, VPRE=VSS) to the selected bit line BL.

At time t5, the write controller 8 applies a pulse voltage at the "H" level to the signal WRS0B and sets the write enable signal WEN0 to the "H" level at the timing of a rise from the "L" level to the "H" level of the signal WRS0B. The write driver 13 corresponding to the write of "0" data applies the voltage VWRT to the selected source line SL.

At time t6, the write controller 8 applies a pulse voltage at the "H" level to the signal WRE0B and sets the write enable signal WEN0 to the "L" level at the timing of a rise from the "L" level to the "H" level of the signal WRE0B. The write driver 13 corresponding to the write of "0" data applies the precharge voltage VPRE (=VSS) to the selected source line SL.

At time t7, the row decoder 3 applies the voltage VSS to the selected word line WL, and the column decoders 4a and 4b set the first column signals CSL1 and the second column signals CSL2 to the "L" level, respectively. Consequently, the write operation ends.

2.5 Effects Relating to the Present Embodiment

The configuration according to the present embodiment can produce effects similar to the effects of the first embodiment.

Moreover, in the present embodiment, the data write operation can be performed on the plurality of core blocks 5 at a time. Therefore, the processing time for the write operation can be reduced, enhancing the processing capability of the semiconductor memory device.

3 Third Embodiment

Now, a third embodiment will be described. In the present embodiment, before data write, the data in the write target memory cells MC is temporarily read. Then, write is executed on the memory cells MC in which the read data RDATA is different from the write data WDATA and not executed on the memory cells MC in which the read data RDATA is the same as the write data WDATA. Only differences from the first embodiment will be described below.

3.1 General Configuration of the Semiconductor Memory Device

First, a general configuration of the semiconductor memory device according to the present embodiment will be described.

FIG. 12 is a block diagram of the semiconductor memory device according to the third embodiment.

As depicted in FIG. 12, a difference from FIG. 1 for the first embodiment is that the write driver 13 receives the read data RDATA from the sense amplifier 14.

3.2 Configuration of the Write Driver

Now, a configuration of the write driver 13 will be described.

FIG. 13 is a circuit diagram of the write driver 13 provided in the semiconductor memory device according to the third embodiment.

As depicted in FIG. 13, the write driver 13 includes NAND circuits 50 and 51, a three-input NOR circuit 52, inverters 53 to 55, n-channel MOS transistors 56 to 59, and p-channel MOS transistors 60 and 61, as is the case with FIG. 4 for the first embodiment. Moreover, the write driver 13 includes AND circuits 62 and 63 and an XOR circuit 64.

Couplings the NOR circuit 52, inverters 53 to 55, and the transistors 56 to 61 are the same as the corresponding couplings in FIG. 4.

The write data WDATA is input to one input terminal of the XOR circuit 64. The read data RDATA is input to the other input terminal of the XOR circuit 64. An output terminal of the XOR circuit 64 is coupled to one input terminal of each of the AND circuits 62 and 63.

The write enable signal WEN1 is input to the other input terminal of the AND circuit 62. An output terminal of the AND circuit 62 is coupled to one input terminal of the NAND circuit 50.

The write enable signal WEN0 is input to the other input terminal of the AND circuit 63. An output terminal of the AND circuit 63 is coupled to one input terminal of the NAND circuit 51.

The write data WDATA is input to the other input terminal of the NAND circuit 50. An output terminal of the NAND circuit 50 is coupled to a gate of the transistor 60 and to an input terminal of the NOR circuit 52 and a gate of the transistor 58 via the inverter 55, as is the case with FIG. 4.

The write data WDATA inverted by the inverter 53 is input to the other input terminal of the NAND circuit 51. An output terminal of the NAND circuit 51 is coupled to a gate of the transistor 61 and to an input terminal of the NOR circuit 52 and a gate of the transistor 56 via the inverter 54, as is the case with FIG. 4.

Specific examples of operations of the write driver 13 in the present embodiment will be described in brief. For example, when both the read data RDATA and the write data WDATA are "0" or "1" data, an output from the XOR circuit 64 is at the "L" level. Therefore, outputs from the AND circuits 62 and 63 are at the "L" level regardless of the write enable signals WEN0 and WEN1. In this case, the write driver 13 does not output the write voltage VWRT. In this case, the precharge voltage VPRE is applied to the global bit line GBL and the global source line GSL. For example, the precharge voltage VPRE and the ground voltage VSS are identical. That is, the precharge voltage VPRE, the voltage of one end of the transistor 56, and the voltage of one end of the transistor 58 are identical. When the data held in the memory cell MC is the same as the write data WDATA, the write operation is not performed.

For example, when the read data RDATA is different from the write data WDATA, the output from the XOR circuit 64 is at the "H" level. Therefore, the output from the AND circuit 62 is at the "H" level when the write enable signal WEN1 is at the "H" level. The output from the AND circuit 63 is at the "H" level when the write enable signal WEN0 is at the "H" level. Therefore, as is the case with FIG. 4 for the first embodiment, when the write enable signal WEN1 is at the "H" level and the write data WDATA is "1" data, the write voltage VWRT is applied to the global bit line GBL, and the voltage VSS is applied to the global source line GSL. Furthermore, when the write enable signal WEN0 is at the "H" level and the write data WDATA is "0" data, the write voltage VWRT is applied to the global source line GSL, and the voltage VSS is applied to the global bit line GBL.

3.3 General Flow of the Write Operation

Now, a general flow of the write operation will be described.

FIG. 14 is a flowchart of the write operation in the semiconductor memory device according to the third embodiment.

As is the case with step S10 in FIG. 6, first, the MRAM 1 receives the write command, the address signals ADDR, and the write data WDATA from the external equipment (step S30).

Then, the logic controller 2 reads the data in the write target memory cell MC (step S31). The read data RDATA is transmitted from the sense amplifier 14 to the write driver 13.

Then, as is the case with step S11 in FIG. 6, the logic controller 2 starts writing "0" data and "1" data (step S32). When the read data RDATA is the same as the write data WDATA, the write driver 13 does not apply the write voltage VWRT. On the other hand, when the read data RDATA is different from the write data WDATA, the write driver 13 applies the write voltage VWRT.

Then, as is the case with step S12 in FIG. 6, the write controller 8 ends the write of "1" data (step S33).

Then, as is the case with step S13 in FIG. 6, the write controller 8 ends the write of "0" data (step S34). Consequently, the write operation ends.

3.4 Effects Relating to the Present Embodiment

The configuration according to the present embodiment can produce effects similar to the effects of the first and second embodiments.

Moreover, in the present embodiment, when the data held in the memory cell MC is the same as the next data to be written, the write voltage VWRT is not applied to the memory cell MC. That is, flow of an unwanted current through the variable resistance element 30 can be suppressed. This allows degradation of the variable resistance element 30 to be prevented. Therefore, reliability of the semiconductor memory device can be enhanced.

4 Fourth Embodiment

Now, a fourth embodiment will be described. The present embodiment corresponds to application of the third embodiment to the second embodiment. Only differences from the first to third embodiments will be described below.

4.1 General Configuration of the Semiconductor Memory Device

First, a general configuration of the semiconductor memory device according to the present embodiment will be described.

FIG. 15 is a block diagram of the semiconductor memory device according to the fourth embodiment.

As depicted in FIG. 15, a difference from FIG. 8 for the second embodiment is that the write driver 13 receives the read data RDATA from the sense amplifier 14.

4.2 Configuration of the Write Driver

Now, a configuration of the write driver 13 will be described. The write driver in the present embodiment is the same as the write driver in FIG. 13 for the third embodiment.

4.3 General Flow of the Write Operation

Now, a general flow of the write operation will be described. The general flow of the write operation is the same as the general flow of the write operation in FIG. 14 for the third embodiment.

4.4 Effects Relating to the Present Embodiment

The configuration according to the present embodiment can produce effects similar to the effects of the first to third embodiments.

5 Fifth Embodiment

Now, a fifth embodiment will be described. A difference from the first and second embodiments is that the write driver 13 includes a level shifter. Only the difference from the first and second embodiments will be described.

5.1 General Configuration of the Semiconductor Memory Apparatus

First, a general configuration of the semiconductor memory device according to the present embodiment will be described.

The general configuration of the semiconductor memory device according to the present embodiment is the same as the general configuration of the semiconductor memory device according to the first or second embodiment.

5.2 Configuration of the Write Driver

A configuration of the write driver 13 will be described. FIG. 16 is a circuit diagram of the write driver 13 provided in the semiconductor memory device according to the fifth embodiment.

As depicted in FIG. 16, the write driver 13 includes a three-input NOR circuit 52, n-channel MOS transistors 56 to 59, and p-channel MOS transistors 60 and 61, as is the case with FIG. 4 for the first embodiment. Moreover, the write driver 13 includes level shifters 70 and 71 and an inverter 72.

Couplings to the transistors 57 and 59 are the same as the corresponding couplings in FIG. 4.

The write data WDATA is input to a data input terminal IN of the level shifter 70. The write enable signal WEN1 is input to an enable signal input terminal EN of the level shifter 70. An output terminal OUT of the level shifter 70 is coupled to the NOR circuit 52 and a gate of the transistor 58. An inverted output terminal OUTB of the level shifter 70 is coupled to a gate of the transistor 60.

Inverted data of the write data WDATA is input to a data input terminal IN of the level shifter 71 via the inverter 72. The write enable signal WEN0 is input to an enable signal input terminal EN of the level shifter 71. An output terminal OUT of the level shifter 71 is coupled to the NOR circuit 52 and a gate of the transistor 56. An inverted output terminal OUTB of the level shifter 71 is coupled to a gate of the transistor 61.

The level shifters 70 and 71 output the write voltage VWRT through the output terminal OUT or the inverted output terminal OUTB as a voltage at the "H" level regardless of the voltage for "1" data in the write data WDATA and the "H" level voltage for the write enable signals WEN0 and WEN1.

The inverter 72 inverts the write data WDATA and outputs the inverted data to the level shifter 71.

Output signals from the level shifters 70 and 71 and the precharge off signal PCHOFF are input to respective three input terminals of the NOR circuit 52. An output terminal of the NOR circuit 52 is coupled to gates of the transistor 57 and the transistor 59 as in the case of FIG. 4.

One end of the transistor 56 is grounded. The other end of the transistor 56 is coupled to one end of the transistor 60 and the global bit line GBL.

One end of the transistor 58 is grounded. The other end of the transistor 58 is coupled to one end of the transistor 61 and the global source line GSL.

The write voltage VWRT is applied to each of other ends (sources) of the transistors 60 and 61. Additionally, the voltage applied to the other end of the transistor 60 and the other end of the transistor 61 may be lower than the write voltage VWRT or voltages with different values may be applied to the other ends of the respective transistor 60 and 61. For example, a write voltage VWRT1 (<VWRT) may be applied to the other end of the transistor 60, and a write voltage VWRT2 (<VWRT) may be applied to the other end of the transistor 61. In this case, the voltage VWRT1 and the voltage VWRT2 may not be the same (VWRT1=VWRT2). That is, the write voltage VWRT1 for "1" data applied to the global bit line GBL may be different from the write voltage VWRT2 for "0" data applied to the global source line GSL.

Specific examples of operations of the write driver 13 in the present embodiment will be described in brief. For example, the write voltage VWRT may be higher than the voltage for "1" data in the write data WDATA and the "H" level voltage for the write enable signals WEN0 and WEN1. In such a case, to allow the transistors 60 and 61 to operate normally (to set the transistors to the off state when a voltage at the "H" level is applied to the gates of the transistors), the voltage level shifts are needed for the write data WDATA and the write enable signals WEN0 and WEN1.

For example, when the write enable signal WEN1 is at the "H" level and the write data WDATA is "1" data, the level shifter 70 outputs an "H" level signal (voltage VWRT) through the output terminal OUT and outputs an "L" level signal (for example, the voltage VSS) through the inverted output terminal OUTB. Furthermore, the level shifter 71 outputs an "L" level signal (for example, the voltage VSS) through the output terminal OUT and outputs an "H" level signal (voltage VWRT) through the inverted output terminal OUTB. Consequently, the transistors 58 and 60 are set to the on state, and the transistor 56 is set to the off state. Moreover, the transistor 61 is more reliably set to the off state because the voltage VWRT is applied to a gate of the transistor 61. Therefore, the write voltage VWRT is applied to the global bit line GBL, and the voltage VSS is applied to the global source line GSL.

Furthermore, when the write enable signal WEN0 is at the "H" level and the write data WDATA is "0" data, the level shifter 70 outputs an "L" level signal (for example, the voltage VSS) through the output terminal OUT and outputs an "H" level signal (voltage VWRT) through the inverted output terminal OUTB. Additionally, the level shifter 71 outputs an "H" level signal (voltage VWRT) through the output terminal OUT and outputs an "L" level signal (for example, the voltage VSS) through the inverted output terminal OUTB. Consequently, the transistors 56 and 61 are set to the on state, and the transistor 58 is set to the off state. Moreover, the transistor 60 is more reliably set to the off state because the voltage VWRT is applied to a gate of the transistor 60. Therefore, the write voltage VWRT is applied to the global source line GSL, and the voltage VSS is applied to the global bit line GBL.

5.3 Configuration of the Level Shifters

Now, a configuration of the level shifters 70 and 71 will be described. The level shifter 70 will be described below, and the level shifter 71 has the same configuration.

Figure 17:
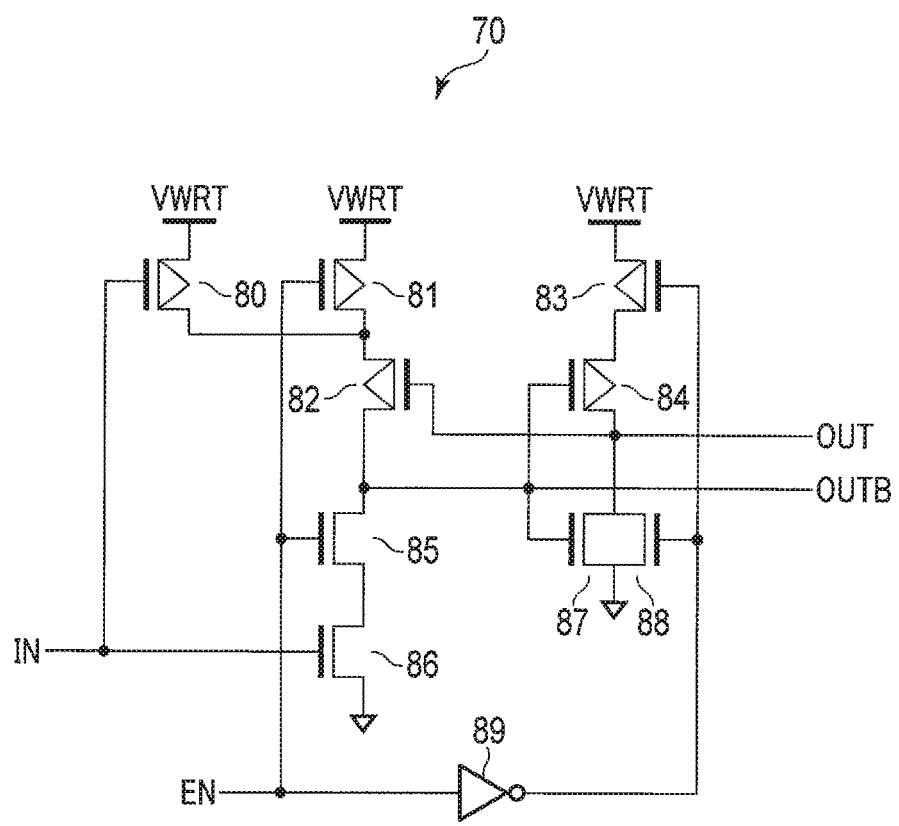
FIG. 17 is a circuit diagram of a level shifter provided in the semiconductor memory device according to the fifth embodiment.

FIG. 17 is a circuit diagram of the level shifter 70 provided in the semiconductor memory device according to the fifth embodiment.

As depicted in FIG. 17, the level shifter 70 includes p-channel MOS transistors 80 to 84, n-channel MOS transistors 85 to 88, and an inverter 89.

A gate of the transistor 80 is coupled to a gate of the transistor 86 and a data input terminal IN (that is, a data input node IN) of the level shifter 70. The write voltage VWRT is applied to one end of the transistor 80. The other end of the transistor 80 is coupled to one end of the transistor 81 and one end of the transistor 82.

A gate of the transistor 81 is coupled to a gate of the transistor 85, an input terminal of the inverter 89, and an enable signal input terminal EN (that is, an enable signal input node EN). The write voltage VWRT is applied to the other end of the transistor 81.

A gate of the transistor 82 is coupled to one ends of the transistors 84, 87, and 88 and an output terminal OUT (that is, an output node OUT). The other end of the transistor 82 is coupled to one end of the transistor 85, gates of the transistors 84 and 87, and an inverted output terminal OUTB (that is, an inverted output node OUTB).

The other end of the transistor 85 is coupled to one end of the transistor 86.

The other end of the transistor 86 is grounded.

A gate of the transistor 83 is coupled to a gate of the transistor 88 and an output terminal of the inverter 89. The write voltage VWRT is applied to one end of the transistor 83. The other end of the transistor 83 is coupled to the other end of the transistor 84.

Other ends of the transistors 87 and 88 are grounded.

Operations of the level shifter 70 will be described in brief. When an "L" level voltage ("L" level signal) is applied to the enable signal input terminal EN, the transistor 81 is set to the on state, and the transistor 85 is set to the off state. Furthermore, an "H" level signal ("H" level voltage) is input to the transistor 88 via the inverter 89, and thus, the transistor 88 is set to the on state. As a result, an "L" level voltage (voltage VSS) is applied to the output terminal OUT. The transistor 82 is set to the on state. Therefore, the write voltage VWRT is applied to the inverted output terminal OUTB via the transistors 81 and 82 to set the inverted output terminal OUTB to the "H" level. That is, the voltage VSS is output through the output terminal OUT as an "L" level voltage. The write voltage VWRT is output through the inverted output terminal OUTB as an "H" level signal.

When an "H" level voltage is applied to the data input terminal IN and the enable signal input terminal EN, the transistors 85 and 86 are set to the on state, thus applying an "L" level voltage to the inverted output terminal OUTB. Consequently, the transistor 84 is set to the on state, and the transistor 87 is set to the off state. Furthermore, an "L" level voltage is applied to the transistor 83 via the inverter 89. Thus, the transistor 83 is set to the on state, and the transistor 88 is set to the off state. Therefore, the write voltage VWRT is applied to the output terminal OUT via the transistors 83 and 84 to set the output terminal OUT to the "H" level. That is, the write voltage VWRT is output through the output terminal OUT as an "H" level voltage. The voltage VSS is output through the inverted output terminal OUTB as an "L" level signal.

When an "H" level voltage is applied to the enable signal input terminal EN with an "L" level voltage applied to the data input terminal IN, the transistors 80 and 85 are set to the on state, and the transistor 86 is set to the off state. Furthermore, an "L" level voltage is applied to the transistor 83 and the transistor 88 via the inverter 89. Thus, the transistor 83 is set to the on state, and the transistor 88 is set to the off state. In a state before an "H" level voltage is applied to the enable signal input terminal EN, an "L" level voltage has been applied to the output terminal OUT, and an "H" level voltage has been applied to the inverted output terminal OUTB, keeping the transistor 82 in the on state. Therefore, the write voltage VWRT is applied to the inverted output terminal OUTB via the transistor 80 and 82. Consequently, the transistor 87 is set to the on state, and thus, an "L" level voltage is applied to the output terminal OUT. That is, as in the case where an "L" level voltage is applied to the enable signal input terminal EN, the voltage VSS is output through the output terminal OUT, and the write voltage VWRT is output through the inverted output terminal OUTB as an "H" level voltage.

5.4 General Flow of the Write Operation

Now, a general flow of the write operation will be described. The general flow of the write operation in the present embodiment is the same as the general flow of the write operation in FIG. 6 for the first embodiment.

5.5 Effects Relating to the Present Embodiment

The configuration according to the present embodiment can produce effects similar to the effects of the first and second embodiments.

Moreover, in the configuration according to the present embodiment, the write driver 13 has the level shifters 70 and 71. Consequently, the write voltage VWRT can be output through the output terminal OUT or the inverted output terminal OUTB of each of the level shifters 70 and 71 regardless of the voltage for "1" data in the write data WDATA and the "H" level voltage for the write enable signals WEN0 and WEN1. The present effect will be described below.

For example, the voltage for "1" data in the write data WDATA and the "H" level voltage for the write enable signals WEN0 and WEN1 may be lower than the write voltage VWRT. In such a case, in the transistors 60 and 61, the voltage for the "H" level signal applied to the gate is lower than the write voltage VWRT applied to the source, possibly precluding the transistors 60 and 61 from being set to the off state.

In contrast, in the configuration according to the present embodiment, the use of the level shifters allows the voltage for the "H" level signal applied to the gates of the transistors 60 and 61 to be made the same as the write voltage VWRT applied to the sources of the transistors 60 and 61. Consequently, the transistors 60 and 61 can be reliably set to the off state. This prevents malfunction of the write driver 13. Therefore, reliability of the semiconductor memory device is enhanced.

Moreover, the write voltages (VWRT1 and VWRT2) applied to the sources of the transistors 60 and 61 can be made lower than the "H" level voltage (VWRT) output by the level shifters 70 and 71. That is, the use of the level shifters 70 and 71 allows the voltage applied to the gates of the transistors 60 and 61 to be made higher than the voltage applied to the sources of the transistors 60 and 61. Thus, the transistors 60 and 61 can be more reliably set to the off state. Therefore, reliability of the semiconductor memory device can be enhanced.

Moreover, different voltages can be set to be applied to the sources of the respective transistors 60 and 61 (VWRT1≠VWRT2). That is, the write voltage for "1" data and the write voltage for "0" data can be set different voltage values. Consequently, optimal write currents corresponding to the respective writes can be passed through the variable resistance element 30. This enables a reduction in write error rate. Therefore, reliability of the semiconductor memory device can be enhanced.

The output voltage value of the level shifters 70 and 71 may be equal to or larger than the voltage VWRT.

Moreover, the write driver 13 in the present embodiment is applicable to the first and second embodiments.

6 Sixth Embodiment

Now, a sixth embodiment will be described. The write driver 13 in the present embodiment is a combination of the write drivers 13 described in the third and fifth embodiments. Only differences from the first to fifth embodiments will be described below.

6.1 General Configuration of the Semiconductor Memory Device

First, a general configuration of the semiconductor memory device according to the present embodiment will be described.

The general configuration of the semiconductor memory device in the present embodiment is the same as the general configuration of the semiconductor memory device in the third embodiment or the fourth embodiment. That is, any configuration may be used so long as the write driver 13 receives the read data RDATA.

6.2 Configuration of the Write Driver

First, a configuration of the write driver 13 will be described.

FIG. 18 is a circuit diagram of the write driver 13 provided in the semiconductor memory device according to the sixth embodiment.

As depicted in FIG. 18, the write driver 13 includes a three-input NOR circuit 52, n-channel MOS transistors 56 to 59, and p-channel MOS transistors 60 and 61, as is the case with FIG. 4 for the first embodiment. Moreover, the write driver 13 includes AND circuits 62 and 63 and an XOR circuit 64 described with reference to FIG. 13 for the third embodiment and level shifters 70 and 71 and an inverter 72 described with reference to FIG. 16 for the fifth embodiment.

Couplings to the transistors 56 to 61, the NOR circuit 52, output terminals OUTPUT and inverted output terminals OUTB of the level shifters 70 and 71, and the inverter 72 are the same as the corresponding couplings in FIG. 16. Furthermore, couplings to input terminals of the AND circuits 62 and 63 and the XOR circuit 64 are the same as the corresponding couplings in FIG. 13.

The write data WDATA is input to one input terminal of the XOR circuit 64. The read data RDATA is input to the other input terminal of the XOR circuit 64. An output terminal of the XOR circuit 64 is coupled to one input terminal of each of the AND circuits 62 and 63.

The write enable signal WEN1 is input to the other input terminal of the AND circuit 62. An output terminal of the AND circuit 62 is coupled to an enable signal input terminal EN of the level shifter 70.

The write enable signal WEN0 is input to the other input terminal of the AND circuit 63. An output terminal of the AND circuit 63 is coupled to an enable signal input terminal EN of the level shifter 71.

The write data WDATA is input to a data input terminal IN of the level shifter 70. The output terminal OUT of the level shifter 70 is coupled to the NOR circuit 52 and a gate of the transistor 58. The inverted output terminal OUTB of the level shifter 70 is coupled to a gate of the transistor 60.

Inverted data of the write data WDATA is input to a data input terminal IN of the level shifter 71 via the inverter 72. The output terminal OUT of the level shifter 71 is coupled to the NOR circuit 52 and a gate of the transistor 56. The inverted output terminal OUTB of the level shifter 71 is coupled to a gate of the transistor 61.

The inverter 72 inverts the write data WDATA and outputs the inverted data to the level shifter 71.

6.3 General Flow of the Write Operation

Now, a general flow of the write operation will be described. The general flow of the write operation in the present embodiment is the same as the general flow of the write operation in FIG. 14 for the third embodiment.

6.4 Effects Relating to the Present Embodiment

The configuration according to the present embodiment can produce effects similar to the effects of the first to the fifth embodiments.

7 Modifications and the Like

The semiconductor memory device according to the above-described embodiments includes a first memory cell (MC in FIG. 2) including a first variable resistance element (30 in FIG. 2) and capable of storing one of first and second data, first and second lines (BL, SL in FIG. 2) coupled to the first memory cell, a first controller (8 in FIG. 1) capable of simultaneously outputting a first signal (WEN1 in FIG. 1) which controls a first data writing and a second signal (WEN0 in FIG. 1) which controls a second data writing, a first driver (13 in FIG. 1) configured to apply a first voltage (VWRT) to the first line and apply a second voltage (VSS) different from the first voltage to the second line according to the first data and an asserted first signal in the first data writing, and apply a third voltage to the first line and apply a fourth voltage different from the third voltage to the second line according to the second data and an asserted second signal in the second data writing.

Application of the above-described embodiments enables provision of a semiconductor memory device that allows reliability to be enhanced. The embodiments are not limited to the above-described forms but may be variously modified.

For example, in a first modification of the sixth embodiment, the level shifters 70 and 71 may exclusively output the inverted output signal. In this case, the inverted output terminals OUTB of the level shifters 70 and 71 are coupled to the gates of the transistors 60 and 61, respectively. An AND signal of the output signal of the AND circuit 62 and the write data WDATA is input to the gate of the transistor 58. An AND signal of the output signal of the AND circuit 63 and the inverted signal of the write data WDATA is input to the gate of the transistor 56.

The first modification will be described in detail using FIG. 19. As depicted in FIG. 19, a write driver 13 in the present modification includes a three-input NOR circuit 52, n-channel MOS transistors 56 to 59, p-channel MOS transistors 60 and 61, AND circuits 62 and 63, an XOR circuit 64, and an inverter 72 as is the case with FIG. 18 for the sixth embodiment. Furthermore, instead of the level shifters 70 and 71 in FIG. 18, the write driver 13 includes level shifters 90 and 91 each having an inverted output terminal OUTB. Moreover, the write driver 13 includes AND circuits 92 and 93. Only differences from FIG. 18 will be described below. The inverted output terminals OUTB of the level shifters 90 and 91 are coupled to gates of the transistors 60 and 61, respectively. An output signal from an AND circuit 62 is input to one input terminal of the AND circuit 92. The write data WDATA is input to the other input terminal of the AND circuit 92. An output terminal of the AND circuit 92 is coupled to a gate of the transistor 58 and an input terminal of the NOR circuit 52. Furthermore, an output signal from the AND circuit 63 is input to one input terminal of the AND circuit 93. An inverted signal for the write data WDATA is input to the other input terminal of the AND circuit 93. An output terminal of the AND circuit 93 is coupled to a gate of the transistor 56 and an input terminal of the NOR circuit 52.

Moreover, in a second modification of the sixth embodiment, the transistors 60 and 61 may be n-channel MOS transistors. In this case, the output terminal OUT of the level shifter 70 is coupled in common to the gates of the transistors 58 and 60. The output terminal OUT of the level shifter 71 is coupled in common to the gates of the transistors 56 and 61.

The second modification will be described in detail using FIG. 20. As depicted in FIG. 20, a write driver 13 in the present modification includes a three-input NOR circuit 52, n-channel MOS transistors 56 to 59, AND circuits 62 and 63, an XOR circuit 64, and an inverter 72 as is the case with FIG. 18 for the sixth embodiment. Furthermore, instead of the p-channel MOS transistors 60 and 61 and the level shifters 70 and 71 in FIG. 18, the write driver 13 includes n-channel MOS transistors 96 and 97 and level shifters 94 and 95 each having an output terminal OUT. Only differences from FIG. 18 will be described below. The output terminal OUT of the level shifter 94 is coupled in common to gates of the transistors 58 and 96 and an input terminal of the NOR circuit 52. The output terminal OUT of the level shifter 95 is coupled in common to gates of the transistors 56 and 97 and an input terminal of the NOR circuit 52.

Moreover, in a third modification of the sixth embodiment, the level shifters 70 and 71 may exclusively output output signals, and the transistors 60 and 61 may be n-channel MOS transistors. In this case, the output terminal OUT of the level shifter 70 is coupled to a gate of the transistor 60. The output terminal OUT of the level shifter 71 is coupled to a gate of the transistor 61. An AND signal of an output signal from the AND circuit 62 and the write data WDATA is input to the gate of the transistor 58. An AND signal of an output signal from the AND circuit 63 and an inverted signal of the write data WDATA is input to the gate of the transistor 56.

The third modification will be described in detail using FIG. 21. As depicted in FIG. 21, a write driver 13 in the present modification includes a three-input NOR circuit 52, n-channel MOS transistors 56 to 59, AND circuits 62 and 63, an XOR circuit 64, and an inverter 72 as is the case with FIG. 18 for the sixth embodiment. Furthermore, instead of the p-channel MOS transistors 60 and 61 and the level shifters 70 and 71 in FIG. 18, the write driver 13 includes n-channel MOS transistors 96 and 97 and level shifters 94 and 95 each having an output terminal OUT. Moreover, the write driver 13 includes AND circuits 92 and 93. Only differences from FIG. 18 will be described below. The output terminal OUT of the level shifter 94 is coupled to a gate of the transistor 96. The output terminal OUT of the level shifter 95 is coupled to a gate of the transistor 97. An output signal from the AND circuit 62 is input to one input terminal of the AND circuit 92. The write data WDATA is input to the other input terminal of the AND circuit 92. An output terminal of the AND circuit 92 is coupled to the gate of the transistor 58 and an input terminal of the NOR circuit 52. Furthermore, an output signal from the AND circuit 63 is input to one input terminal of the AND circuit 93. An inverted signal of the write data WDATA is input to the other input terminal of the AND circuits 93. An output terminal of the AND circuit 93 is coupled to the gate of the transistor 56 and an input terminal of the NOR circuit 52.

In the above-described embodiments, the voltage of the one end, which is grounded, of the transistor 56 may be different from the voltage of the one end, which is grounded, of the transistor 58. In this case, the difference is allowed as an error if the error is within a range in which a normal operation of the MRAM can be obtained.

In the above-described embodiments, in the case where the term "identical" or "same" is used for the voltages, the term "identical" or "same" does not necessarily require strict coincidence, and allows for a certain degree of error so long as the effect of the embodiment can be produced. For example, when the precharge voltage VPRE and the ground voltage VSS are identical, a value of each voltage does not necessarily require strict coincidence, and a numerical difference is allowed as an error if the error is within a range in which a normal operation of the MRAM can be obtained.

The MRAM illustrated in the above-described embodiments may be an STT-MRAM (spin-transfer torque magnetoresistive random access memory) that utilizes a spin injection phenomenon for magnetization reversal in a magnetic layer.

In the above-described embodiments, as a semiconductor memory device, the MRAM including magnetic tunnel junction (MTJ) elements has been described by way of example.

However, the present invention is not limited to this. For example, the present invention is applicable to semiconductor memory devices in general which have elements that store data using resistance changes, for example, ReRAM (resistive random access memory) and PCRAM (phase-change random access memory). Furthermore, the present invention is applicable to semiconductor memory devices having elements enabling storage of data based on a resistance change resulting from application of a current or a voltage or allowing stored data to be read by converting a resistance difference resulting from a resistance change into a current difference or a voltage difference, regardless of whether the semiconductor memory device is a volatile memory or a nonvolatile memory.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first memory cell including a first variable resistance element and capable of storing one of first and second data;
   first and second lines coupled to the first memory cell;
   a first controller capable of simultaneously outputting a first signal which controls a first data writing and a second signal which controls a second data writing; and
   a first driver configured to apply a first voltage to the first line and apply a second voltage different from the first voltage to the second line according to the first data and an asserted first signal in the first data writing, and apply a third voltage to the first line and apply a fourth voltage different from the third voltage to the second line according to the second data and an asserted second signal in the second data writing.

2. The device according to claim 1, further comprising:
   a second memory cell including a second variable resistance element and capable of storing one of the first and second data;
   third and fourth lines coupled to the second memory cell; and
   a second driver configured to apply the first voltage to the third line and apply the second voltage to the fourth line according to the first data and the asserted first signal in the first data writing, and apply the third voltage to the third line and apply the fourth voltage to the fourth line according to the second data and the asserted second signal in the second data writing,
   wherein when the first data is written to the first variable resistance element and the second data is written to the second variable resistance element, a first period when a first current is supplied to the first resistance element based on the first and second voltages applied to the first and second lines, respectively, at least partly overlaps a second period when a second current is supplied to the second resistance element based on the third and fourth voltages applied to the third and fourth lines, respectively, and the first period is different in length from the second period.

3. The device according to claim 1, wherein the first voltage and the fourth voltage are approximately identical, and the second voltage and the third voltage are approximately identical.

4. The device according to claim 1, wherein the first voltage is different from the fourth voltage, and the second voltage and the third voltage are approximately identical.

5. The device according to claim 1, further comprising:
third and fourth lines coupled to the first driver;
a first circuit including a first switching element coupling the first line and the third line; and
a second circuit including a second switching element coupling the second line and the fourth line.

6. The device according to claim 1, wherein the first driver includes:
a first switching element configured to transfer the first voltage to the first line;
a second switching element configured to transfer the second voltage to the second line;
a third switching element configured to transfer the third voltage to the first line; and
a fourth switching element configured to transfer the fourth voltage to the second line, and
the first driver sets the first and second switching elements to an on state and sets the third and fourth switching elements to an off state, based on the first data and the asserted first signal, and sets the first and second switching elements to the off state and sets the third and fourth switching elements to the on state, based on the second data and the asserted second signal.

7. The device according to claim 1, further comprising:
a data buffer configured to store 1-bit data and to transfer the 1-bit data to the first driver.

8. The device according to claim 1, further comprising:
a first switching element included in the first memory cell; and
a first decoder configured to decode address signals and to set the first switching element to an on state based on a decode result for the address signals,
wherein a first end of the first variable resistance element is coupled to the first line, and a second end of the first variable resistance element is coupled to the second line via the first switching element.

9. The device according to claim 1, further comprising:
a first decoder configured to decode address signals and to control the first controller based on a decode result for the address signals.

10. The device according to claim 1, further comprising:
a second controller configured to transmit a third signal to the first controller,
wherein the first controller transmits the first and second signals to the first driver based on the third signal.

11. The device according to claim 1, further comprising:
a second controller configured to transmit a third signal to the first controller,
wherein, upon receiving the third signal, the first controller sets the first and second signals to a first logic level,
sets the first signal to a second logic level when the first period has passed since setting of the first and second signals to the first logic level, and sets the second signal to the second logic level when the second period has passed since setting of the first and second signals to the first logic level.

12. The device according to claim 2, wherein the first controller sets the first and second signals to a first logic level while the first and second periods overlap, sets the first signal to the first logic level while the first period does not overlap the second period during the first period, and sets the second signal to the first logic level while the second period does not overlap the first period during the second period.

13. The device according to claim 2, wherein when the first data is written to the first memory cell and the second data is written to the second memory cell, a third period is provided which does not overlap the first and second periods and when one of the first and second currents is supplied to one of the first and second variable resistance elements.

14. The device according to claim 5, further comprising:
a first decoder configured to decode address signals and to set the first switching element to an on state based on a decode result of the first decoder; and
a second decoder configured to decode the address signals and to set the second switching element to an on state based on a decode result of the second decoder.

15. The device according to claim 5, further comprising:
a second memory cell including a second variable resistance element and capable of storing one of the first and second data; and
fifth and sixth lines coupled to the second memory cell,
wherein the first circuit further includes a third switching element which couples the fifth line and the third line,
the second circuit further includes a fourth switching element which couples the sixth line and the fourth line together,
the first circuit is capable of coupling one of the first and fifth lines to the third line, and
the second circuit is capable of coupling one of the second and sixth lines to the fourth lines.

16. The device according to claim 8, wherein the first switching element is an NMOS transistor, and a gate of the NMOS transistor is coupled to the first decoder.

17. The device according to claim 1, wherein the first driver applies the first voltage to the first line and applies the second voltage to the second line, or applies the third voltage to the first line and applies the fourth voltage to the second line when data stored in the first memory cell is different from write data written to the first memory cell, and
the first driver applies a fifth voltage to the first line and the second line when the data stored in the first memory cell is identical to the write data.

18. The device according to claim 17, wherein the fifth voltage, the second voltage, and the third voltage are approximately identical.

19. The device according to claim 1, wherein the first and fourth voltages are higher than voltages corresponding to the first and second data and the first and second signals, respectively.

20. The device according to claim 19, wherein the first driver includes:
a first switching element configured to transfer the first voltage to the first line;
a second switching element configured to transfer the second voltage to the second line;
a third switching element configured to transfer the third voltage to the first line;
a fourth switching element configured to transfer the fourth voltage to the second line;

a first level shifter including first to third terminals, the one of the first and second data being input to the first terminal, the first signal being input to the second terminal, the third terminal being coupled to one of the first and second switching elements, the first level shifter being configured to output, through the third terminal, a fifth voltage higher than the first and fourth voltages; and a second level shifter including first to third terminals, data resulting from inversion of the one of the first and second data being input to the first terminal, the second signal being input to the second terminal, the third terminal being coupled to one of the third and fourth switching elements, the second level shifter being configured to output the fifth voltage through the third terminal, and the first driver sets the first and second switching elements to an on state and sets the third and fourth switching elements to an off state, based on the first data and the asserted first signal, and sets the first and second switching elements to the off state and sets the third and fourth switching elements to the on state, based on the second data and the asserted second signal.

\* \* \* \* \*